(12) United States Patent
Sano et al.

(10) Patent No.: US 10,797,035 B1
(45) Date of Patent: Oct. 6, 2020

(54) BONDED ASSEMBLY CONTAINING SIDE BONDING STRUCTURES AND METHODS OF MANUFACTURING THE SAME

(71) Applicant: SANDISK TECHNOLOGIES LLC, Addison, TX (US)

(72) Inventors: Michiaki Sano, Ichinomiya (JP); Takashi Yamaha, Obu (JP); Koichi Ito, Yokkaichi (JP); Ikue Yokomizo, Nagoya (JP); Ryo Hiramatsu, Yokkaichi (JP); Kazuto Watanabe, Nagoya (JP); Katsuya Kato, Yokkaichi (JP); Hajime Yamamoto, Nagoya (JP); Hiroshi Sasaki, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/372,908

(22) Filed: Apr. 2, 2019

(51) Int. Cl.
| | |
|---|---|
| *H01L 25/18* | (2006.01) |
| *H01L 23/528* | (2006.01) |
| *H01L 23/522* | (2006.01) |
| *H01L 23/00* | (2006.01) |

(52) U.S. Cl.
CPC .......... *H01L 25/18* (2013.01); *H01L 23/5226* (2013.01); *H01L 23/5283* (2013.01); *H01L 24/09* (2013.01); *H01L 24/49* (2013.01)

(58) Field of Classification Search
None
See application file for complete search history.

(56) References Cited

U.S. PATENT DOCUMENTS

| 10,115,681 | B1 | 10/2018 | Ariyoshi | |
|---|---|---|---|---|
| 2007/0278648 | A1 | 12/2007 | Akram | |
| 2009/0321950 | A1 | 12/2009 | Takiar et al. | |
| 2016/0079164 | A1* | 3/2016 | Fukuzumi | ............... H01L 24/80 257/324 |

OTHER PUBLICATIONS

Tomoaki Shoji, "Important Technologies for the IoT / CPS era that Toshiba Shibata talks about (2/2)", EE Time Japan, Mar. 31, 2017, 5 pages, found at "http://eetimes.jp/ee/articles/1703/31/news088_2.html".
U.S. Appl. No. 15/873,101, filed Jan. 17, 2018, SanDisk Technologies LLC.
U.S. Appl. No. 15/892,477, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.

(Continued)

*Primary Examiner* — Herve-Louis Y Assouman
(74) *Attorney, Agent, or Firm* — The Marbury Law Group PLLC

(57) ABSTRACT

A bonded assembly includes a first stack containing a first semiconductor die bonded to a second semiconductor die along a stacking direction, first external bonding pads formed within the first semiconductor die, and bonding connection wires. Each of the bonding connection wires extends over a sidewall of the first semiconductor die and protrudes into the first semiconductor die through the sidewall of the first semiconductor die to contact a respective one of the first external bonding pads.

20 Claims, 23 Drawing Sheets

(56) References Cited

OTHER PUBLICATIONS

U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/321,752, filed Dec. 24, 2018, SanDisk Technologies LLC.
U.S. Appl. No. 16/242,216, filed Jan. 8, 2019, SanDisk Technologies LLC.
U.S. Appl. No. 16/243,469, filed Jan. 16, 2019, SanDisk Technologies LLC.
U.S. Appl. No. 16/248,923, filed Jan. 16, 2019, SanDisk Technologies LLC.
U.S. Appl. No. 16/249,423, filed Jan. 23, 2019, SanDisk Technologies LLC.
U.S. Appl. No. 16/255,413, filed Jan. 23, 2019, SanDisk Technologies LLC.
U.S. Appl. No. 16/274,687, filed Feb. 13, 2019, SanDisk Technologies LLC.
U.S. Appl. No. 16/284,502, filed Feb. 25, 2019, SanDisk Technologies LLC.
U.S. Appl. No. 16/278,372, filed Feb. 18, 2019, SanDisk Technologies LLC.
U.S. Appl. No. 16/295,292, filed Mar. 7, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/269,301, filed Feb. 6, 2019, SanDisk Technologies LLC.
U.S. Appl. No. 16/275,668, filed Feb. 14, 2019, SanDisk Technologies LLC.
U.S. Appl. No. 16/288,656, filed Feb. 28, 2019, SanDisk Technologies LLC.
Notification of Transmittal of the International Search Report and Written Opinion of the International Search Authority or International Patent Application No. PCT/US2019/068642, dated Apr. 1, 2020, 13 pages.

* cited by examiner

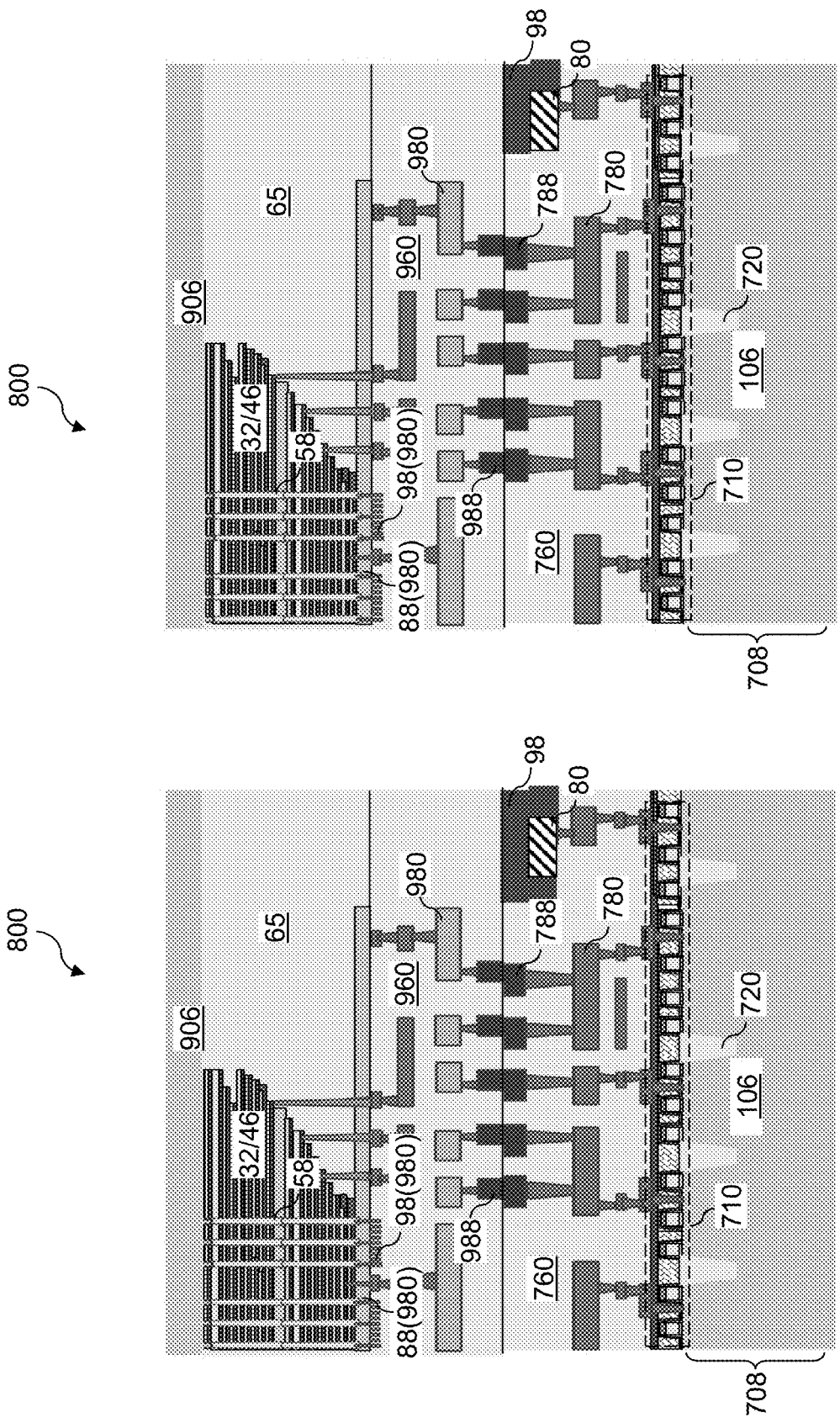

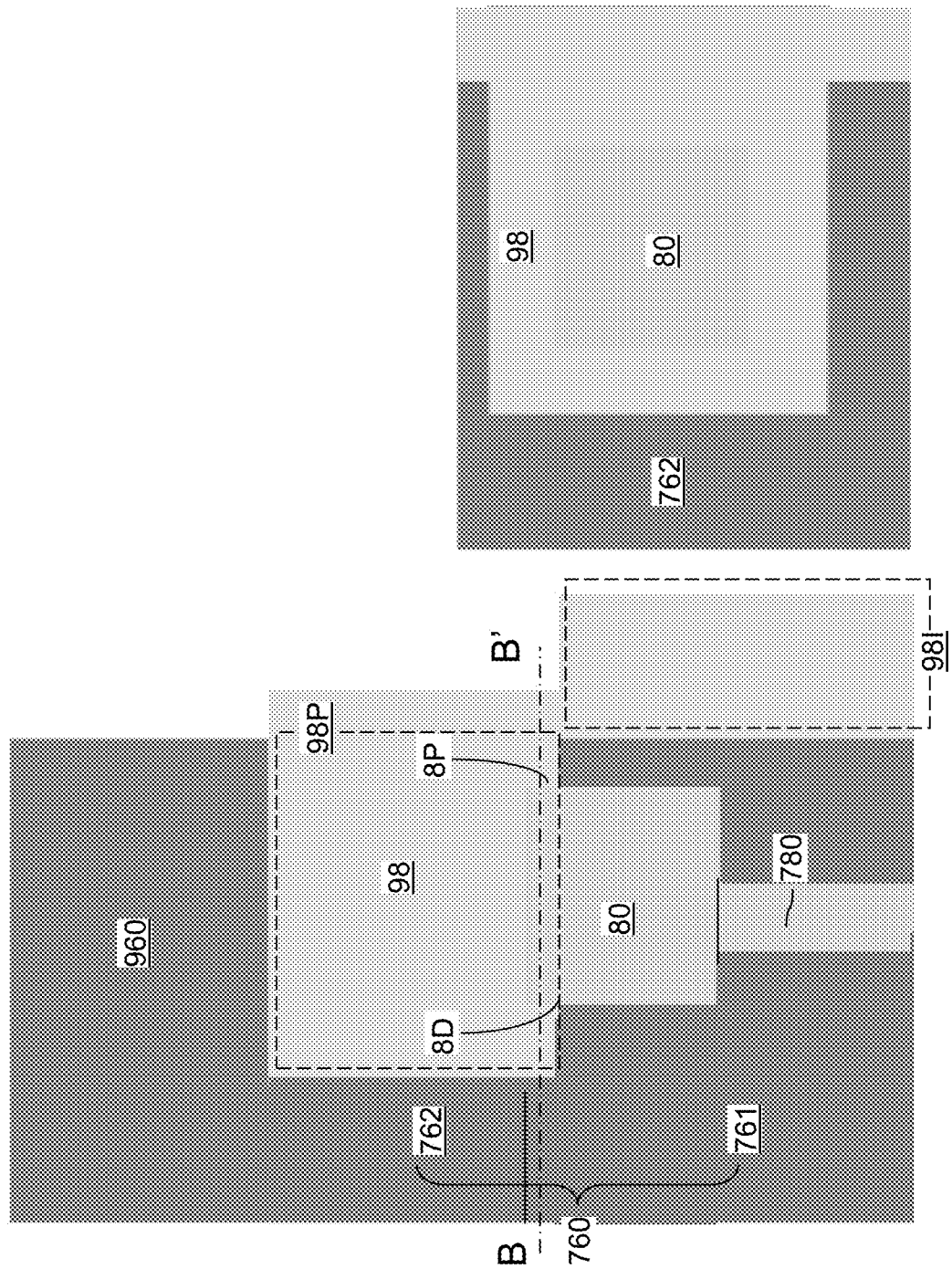

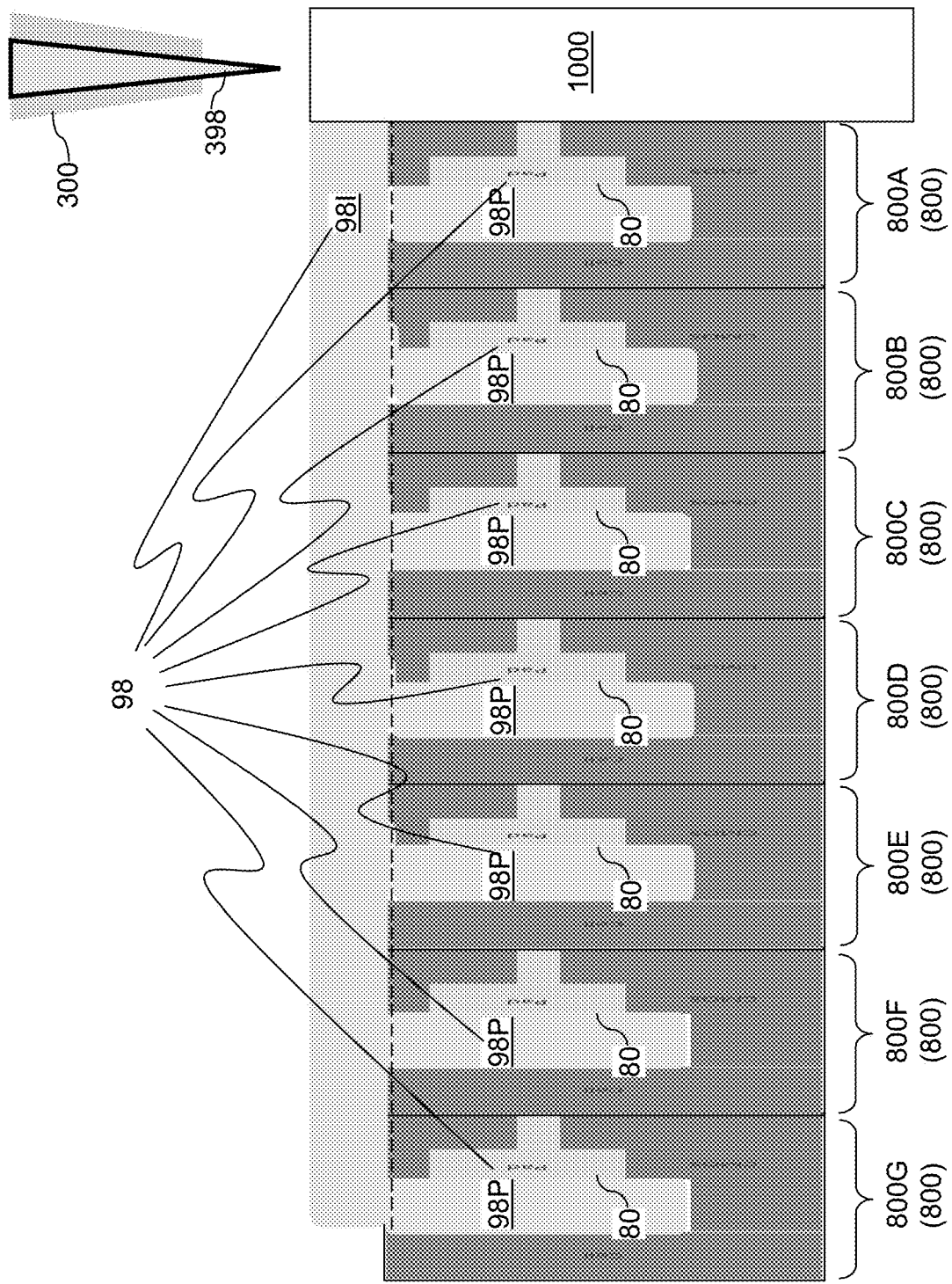

US 10,797,035 B1

BONDED ASSEMBLY CONTAINING SIDE BONDING STRUCTURES AND METHODS OF MANUFACTURING THE SAME

FIELD

The present disclosure relates generally to the field of semiconductor devices, and particular to a bonded assembly using side bonding structures located on sidewalls of semiconductor dies and methods of manufacturing the same.

BACKGROUND

Multiple semiconductor dies may be bonded together to provide a bonded assembly. Providing reliable electrical connections across the multiple semiconductor dies may be a challenge because the external bonding pads of the semiconductor dies on the top surfaces of the semiconductor dies are typically physically exposed in order to attach the external bonding pads to bonding wires. A configuration that staggers the semiconductor dies results in lateral expansion of the size of the bonded assembly. Limiting the lateral size of the bonded assembly requires reduction of die size for the semiconductor dies that are stacked at an upper end.

SUMMARY

According to an embodiment of the present disclosure, a bonded assembly includes a first stack containing a first semiconductor die bonded to a second semiconductor die along a stacking direction, first external bonding pads formed within the first semiconductor die, and bonding connection wires. Each of the bonding connection wires extends over a sidewall of the first semiconductor die and protrudes into the first semiconductor die through the sidewall of the first semiconductor die to contact a respective one of the first external bonding pads.

According to another embodiment of the present disclosure, a method of forming a bonded assembly is provided, which comprises: forming a first external bonding pad on a front side of a first semiconductor die; forming first bonding pads on the first semiconductor die such that bonding-side surfaces of the first bonding pads are more distal from a substrate of the first semiconductor die than a front-side surface of the first external bonding pad is from the substrate; forming a first sacrificial pad cover structure over the first external bonding pad; bonding a second semiconductor die to the first semiconductor die such that the first bonding pads of the first semiconductor die are bonded to second bonding pads of the second semiconductor die; forming a first side cavity by removing the first sacrificial pad cover structure from a sidewall of the first semiconductor die; and forming a bonding connection wire by injecting a bonding wire material into the first side cavity directly on the first external bonding pad and by continuously extracting the bonding wire material over the sidewall of the first semiconductor die.

BRIEF DESCRIPTION OF THE DRAWINGS

FIGS. 9A and 9B are vertical cross-sectional views of second and third alternative configurations of the first exemplary structure according to embodiments of the present disclosure.

FIG. 19A is a vertical cross-sectional view of a region of one of the first exemplary structures of FIGS. 7-9.

FIG. 19B is a horizontal cross-sectional view along the horizontal plane B-B' of the region of FIG. 19A.

FIG. 25 is a cross-sectional view of an alternative embodiment of the second exemplary structure including a plurality of bonded semiconductor dies after the processing steps of FIGS. 7-9, 19A, and 19B according to an embodiment of the present disclosure.

DETAILED DESCRIPTION

Figure 2:
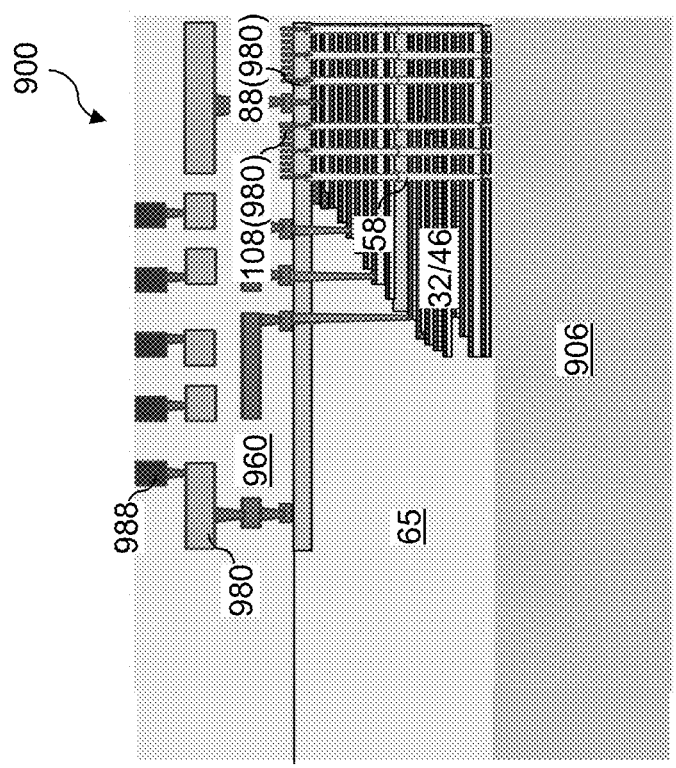
FIG. 2 is a schematic vertical cross-sectional view of a second semiconductor die after formation of second bonding pads according to an embodiment of the present disclosure.

As discussed above, the embodiments of the present disclosure are directed to a bonded assembly using side bonding structures located on sidewalls of semiconductor dies and methods of manufacturing the same, the various embodiments of which are described below. The embodiments of the disclosure may be used to form a bonded assembly including at least one memory die and at least one logic die and optionally including a packaging substrate. The embodiments disclosed herein provide a structure and a method that provides electrical connections across multiple semiconductor dies without requiring lateral size expansion of the bonded assembly or gradual decrease in die size in upper semiconductor dies. The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status.

Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1:
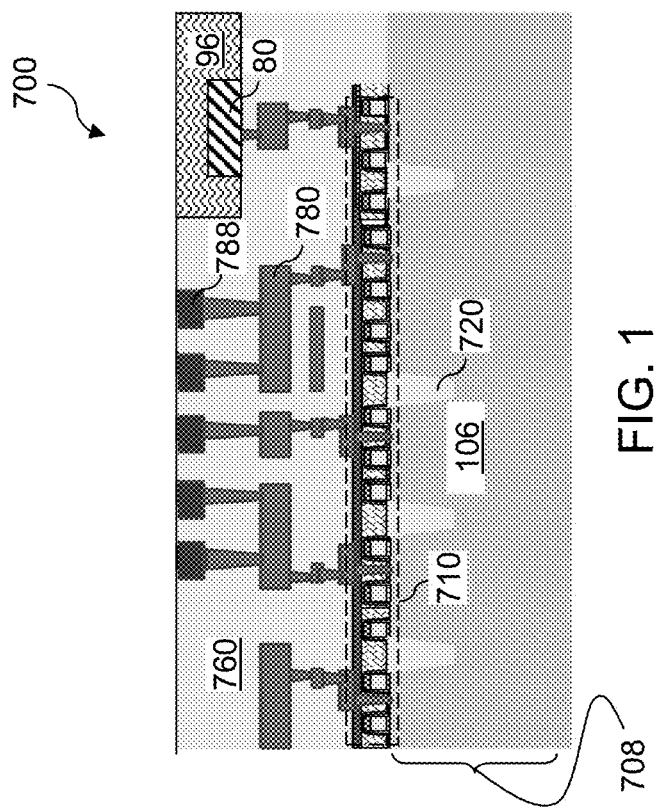
FIG. 1 is a schematic vertical cross-sectional view of a first semiconductor die after formation of first bonding pads, external bonding pads, and sacrificial pad cover structures according to an embodiment of the present disclosure.

Referring to FIG. 1, a first semiconductor die 700 according to an embodiment of the present disclosure is illustrated. The first semiconductor die 700 may be a logic die or a memory die. The first semiconductor die 700 may include first semiconductor devices 710 formed on a first semiconductor substrate 106. The first semiconductor devices 710 may include field effect transistors and/or memory devices such as a three-dimensional memory array. First dielectric material layers 760 may be formed over the first semiconductor devices 710, and first metal interconnect structures 780 may be formed within the first dielectric material layers 760. First bonding pads 788 may be formed in, or on, an uppermost layer of the first dielectric material layers 760. The first bonding pads 788 may be die-to-die bonding pads that are configured to be bonded to die-to-die bonding pads of another semiconductor die, such as a second semiconductor die 900 illustrated in FIG. 2. First external bonding pads 80 formed within a respective first sacrificial pad cover structure 96 may be formed on the first semiconductor die 700.

The side of the first semiconductor die 700 including the first dielectric material layers 760 and the first bonding pads 788 (which are first die-to-die bonding pads) is herein referred to as a front side of the first semiconductor die 700. The side of the first semiconductor die 700 including the first semiconductor substrate 106 is herein referred to as a backside of the first semiconductor die 700. Each of the first bonding pads 788 may be a metal bonding pad that may form metal-to-metal bonding. For example, the first bonding pads 788 may comprise copper at a material composition that provides copper-to-copper bonding.

Each of the first external bonding pads 80 may be formed within a respective first sacrificial pad cover structure 96. The first bonding pads 788 may be formed on the first semiconductor die 700 such that bonding-side surfaces of the first bonding pads 788 are more distal from the first semiconductor substrate 106 (i.e., the substrate of the first semiconductor die 700) than a surface of the first external bonding pads 80 are from the first semiconductor substrate 106. In other words, the first external bonding pads 80 are vertically recessed relative to the horizontal plane including the top surfaces of the first bonding pads 788. Each first sacrificial pad cover structure 96 may be formed over a respective first external bonding pad 80, and may have a top surface located within the horizontal plane including the top surfaces of the first bonding pads 788. The methods of forming external bonding pads such as the first bonding pads 788 of the first semiconductor die 700 are subsequently described in detail.

Referring to FIG. 2, a second semiconductor die 900 according to an embodiment of the present disclosure is illustrated. The second semiconductor die 900 may be a logic die or a memory die. The second semiconductor die 900 may include second semiconductor devices formed on a second semiconductor substrate 906. The second semiconductor devices may include field effect transistors and/or memory devices such as a three-dimensional memory array. In an illustrative example, the second semiconductor devices may include an alternating stack of insulating layers 32 and electrically conductive layers 46 that function as word lines, and memory stack structures 58 vertically extending through the alternating stack (32, 46). In this case, each of the memory stack structures 58 may include a respective vertical semiconductor channel and a respective memory film. Each memory film may include a layer stack of a charge storage layer and a tunneling dielectric layer. Each vertical semiconductor channel may be connected to a source region at one end such as a bottom end, and may be connected to a drain region at another end such as a top end. A retro-stepped dielectric material portion 65 may be formed on stepped surfaces of the alternating stack (32, 46). Second dielectric material layers 960 may be formed over the second semiconductor devices, and second metal interconnect structures 980 may be formed in the second dielectric material layers 960. In case the second semiconductor die 900 includes a three-dimensional array of memory elements, the second metal interconnect structures 980 may include drain contact via structures 88 that contact the drain regions, and bit lines 108 that laterally extend along a horizontal direction that is perpendicular to a lengthwise direction of the word lines as embodied as the electrically conductive layers 46.

Second bonding pads 988 may be formed in, or on, an uppermost layer of the second dielectric material layers 960. The second bonding pads 988 may be die-to-die bonding pads that are configured to be bonded to die-to-die bonding pads of another semiconductor die, such as the first semiconductor die 700 illustrated in FIG. 1. In one embodiment, the second bonding pads 988 may have an image pattern that mirrors the pattern of the first bonding pads 788. In one embodiment, the second semiconductor die 900 may be a memory die including a three-dimensional array of memory elements, and the first semiconductor die 700 may include a peripheral circuitry that controls operation of the three-dimensional array of memory elements. In one embodiment, the first semiconductor die 700 and the second semiconductor die 900 may be memory dies.

Figures 3, 4:
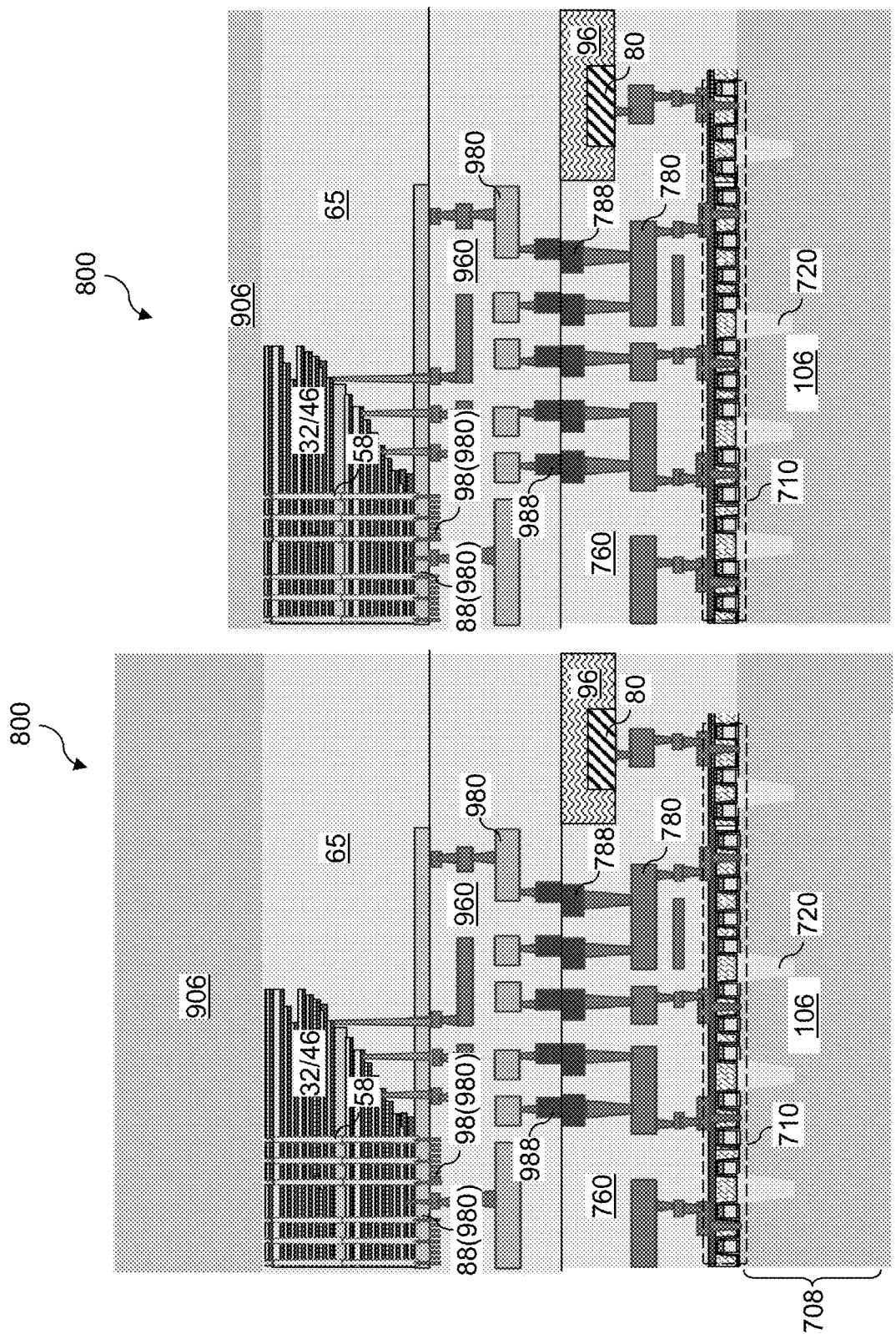
FIG. 3 is a vertical cross-sectional view of a first exemplary structure after bonding the second semiconductor die to the first semiconductor die according to an embodiment of the present disclosure.
FIG. 4 is a vertical cross-sectional view of the first exemplary structure after thinning the substrate of the second semiconductor die according to an embodiment of the present disclosure.

Referring to FIG. 3, the second bonding pads 988 may be bonded to the first bonding pads 788 to form a bonded assembly comprising a stack 800 of two bonded dies including the first semiconductor die 700 and the second semiconductor die 900. One side of the bonded assembly, such as the side including the second semiconductor substrate 906, is herein referred to as a front side, and another side of the bonded assembly, such as the side including the first semiconductor substrate 106, is herein referred to as a backside. As such, the first bonding pads 788 of the first semiconductor die 700 is herein referred to as front-side bonding pads 788 of the first semiconductor die 700 (which is located on the front side of the first semiconductor die 700 in the bonded state), and the second bonding pads 988 of the second semiconductor die 900 is herein referred to as backside bonding pads 988 of the second semiconductor die 900 (which is located on the backside of the second semiconductor die 900 in the bonded state). Thus, the front-side bonding pads 788 of the first semiconductor die 700 are bonded to the backside bonding pads 988 of the second semiconductor die 900.

Referring to FIG. 4, the second semiconductor substrate 906, i.e., the substrate of the second semiconductor die 900, may be thinned, for example, by grinding, polishing, an isotropic etch process, and/or an anisotropic etch process. In one embodiment, the thickness of the second semiconductor substrate 906 may be in a range from 1 micron to 60 microns so that through-substrate contact via structures may be subsequently formed through the second semiconductor substrate 906.

Figure 5:
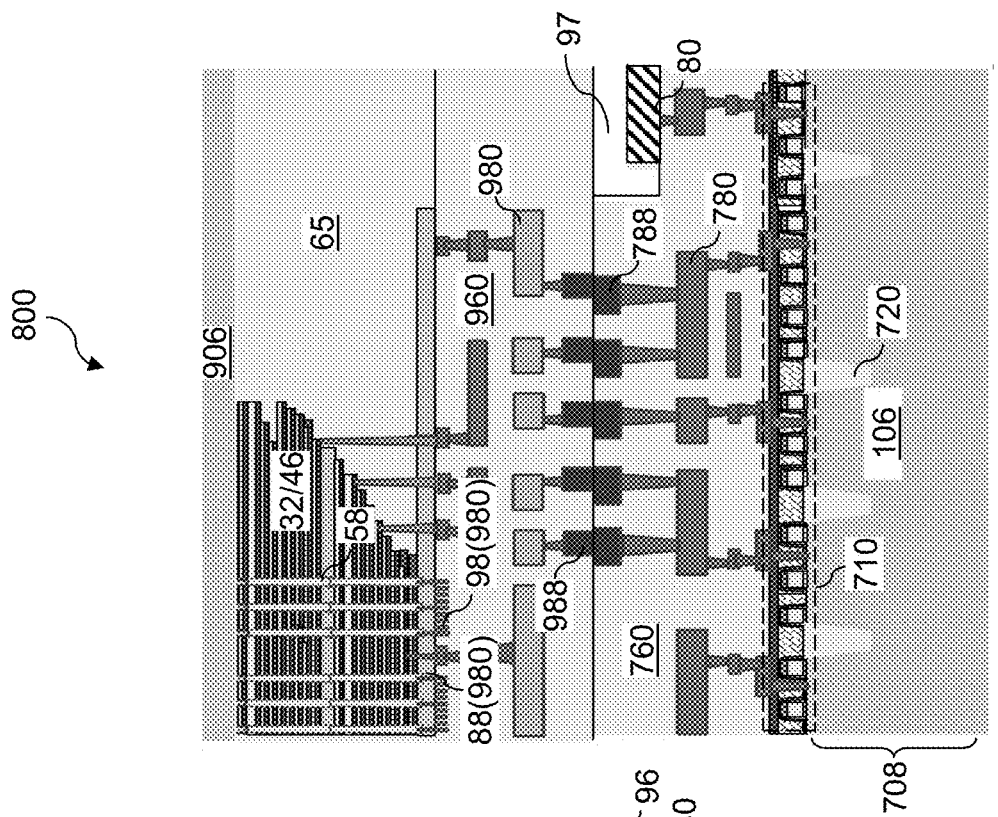
FIG. 5 is a vertical cross-sectional view of the first exemplary structure after optional lateral polishing according to an embodiment of the present disclosure.

Referring to FIG. 5, the bonded assembly comprising the stack 800 may be optionally thinned on one or more sides of the bonded assembly that includes the first sacrificial pad cover structure 96. If the first sacrificial pad cover structure 96 are provided only on one side of the bonded assembly, the side of the bonded assembly including the first sacrificial pad cover structure 96 may be thinned. If the first sacrificial pad cover structure 96 are provided on multiple sides, each side including the first sacrificial pad cover structure 96 may, or may not, be thinned. Portions of the first semiconductor die 700 and the second semiconductor die 900 adjacent to each thinned side may be removed during the thinning process. The thinning process may use polishing, grinding, an isotropic etch process, and/or an anisotropic etch process. In embodiments where the first sacrificial pad cover structure 96 is physically exposed to any sidewall of the bonded assembly, such a side may, or may not, be thinned. If any of the first sacrificial pad cover structure 96 is not physically exposed in the bonded assembly of FIG. 4, such a side may be thinned until each buried first sacrificial pad cover structure 96 may be physically exposed. In one embodiment, sidewalls of the first sacrificial pad cover structure 96 may be physically exposed and sidewalls of the first external bonding pads 80 may not be physically exposed after thinning, or without thinning in case the thinning process is omitted. In another embodiment, sidewalls of the first sacrificial pad cover structure 96 may be physically exposed and sidewalls of the first external bonding pads 80 may be physically exposed after thinning, or without thinning in case the thinning process is omitted.

Figure 6:
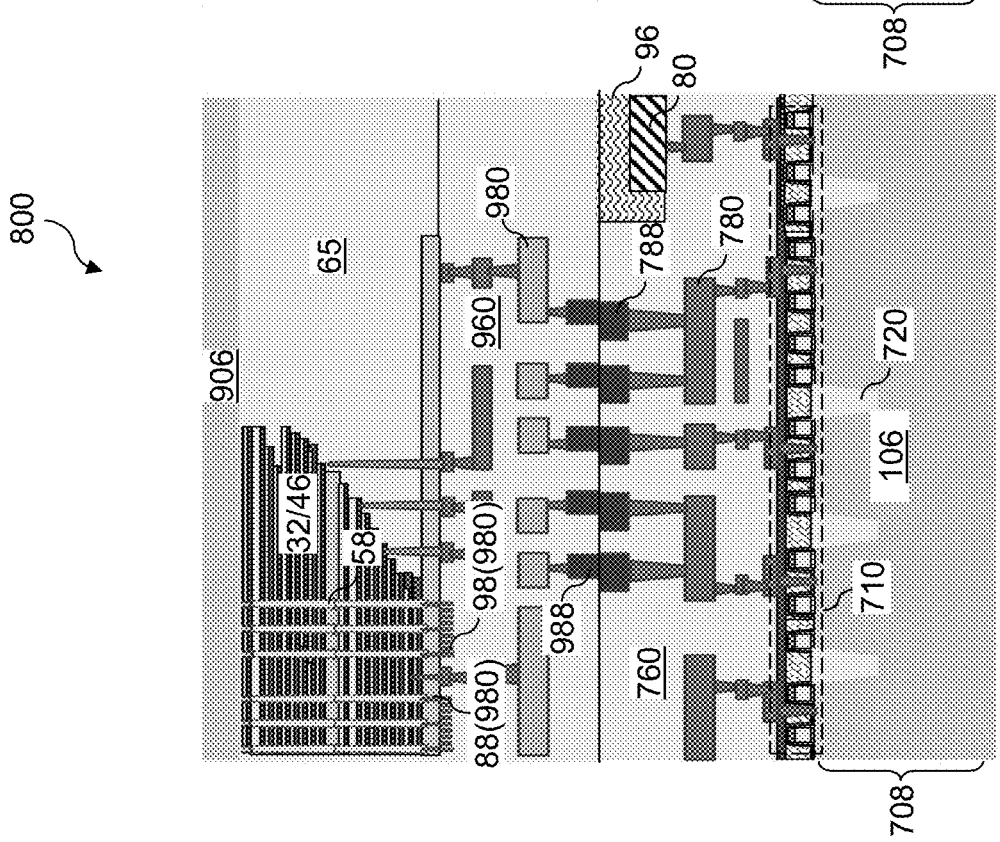
FIG. 6 is a vertical cross-sectional view of the first exemplary structure after removal of the sacrificial pad cover structures according to an embodiment of the present disclosure.

Referring to FIG. 6, the first sacrificial pad cover structures 96 may be removed selective to the materials of the first dielectric material layers 760, the second dielectric material layers 960, and the first external bonding pads 80. First side cavities 97 may be formed in volumes from which the first sacrificial pad cover structures 96 are removed. In one embodiment, removal of the first sacrificial pad cover structures 96 from the sidewall(s) of the first semiconductor die 700 may be effected by isotropically removing the material of the first sacrificial pad cover structures 96 selective to materials of the first external bonding pads 80 and the dielectric material layers (760, 960) of the first semiconductor die 700 and the second semiconductor die 900 (which include a pad-level dielectric material layer that has formed therein the front-side bonding pads 788).

Figure 7:
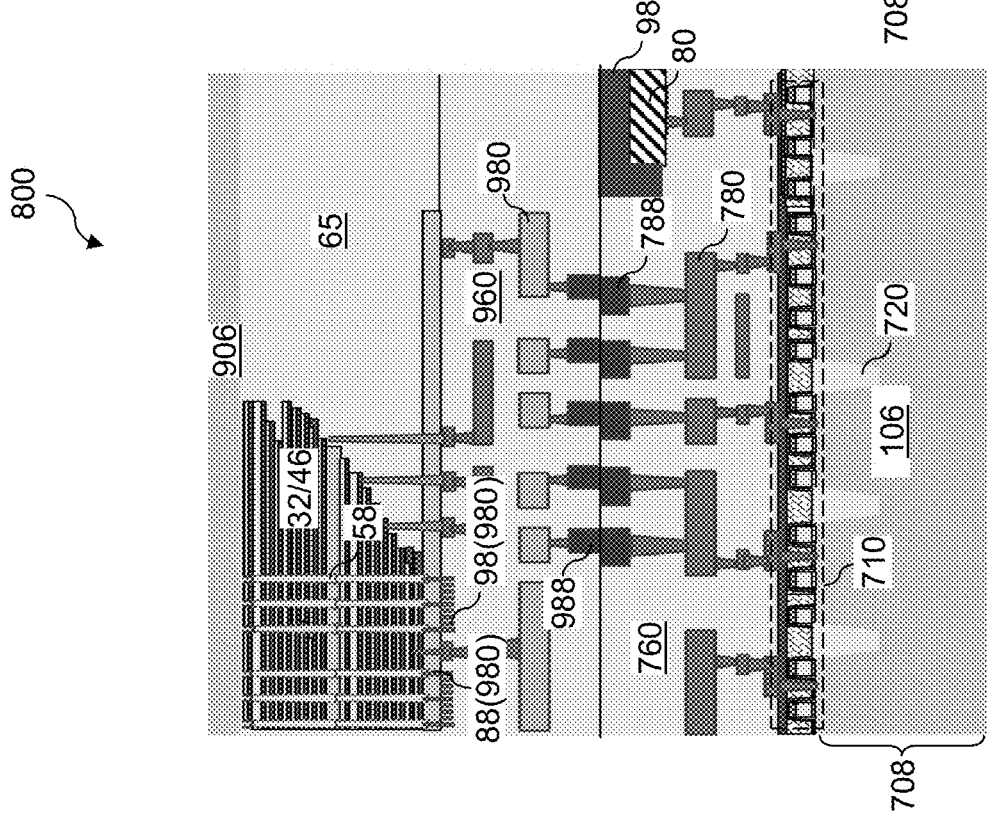
FIG. 7 is a vertical cross-sectional view of the first exemplary structure after formation of bonding connection wires in cavities formed by removal of the sacrificial pad cover structures according to an embodiment of the present disclosure.

Referring to FIG. 7, a metallic bonding material may be applied into each of the first side cavities 97, and may be subsequently extracted to form bonding connection wires 98. The bonding connection wires 98 may be anchored to the first external bonding pad 80 by filling the distal sidewall of the first external bonding pad 80. The bonding connection wires 98 may continuously extend to another semiconductor die (which may, or may not, be another bonded assembly comprising a stack 800) and/or to another substrate, such as a packaging substrate (not shown), and may be bonded to a respective external bonding pad located on the semiconductor die or the substrate. FIG. 7 illustrates an embodiment in which a sidewall of a first external bonding pad 80 is vertically coincident with sidewalls of the first semiconductor die 700 and the second semiconductor die 900. As used herein, a first surface and a second surface are vertically coincident with each other if there exists a vertical plane including the first surface and the second surface and if the second surface overlies or underlies the first surface.

Figure 8:
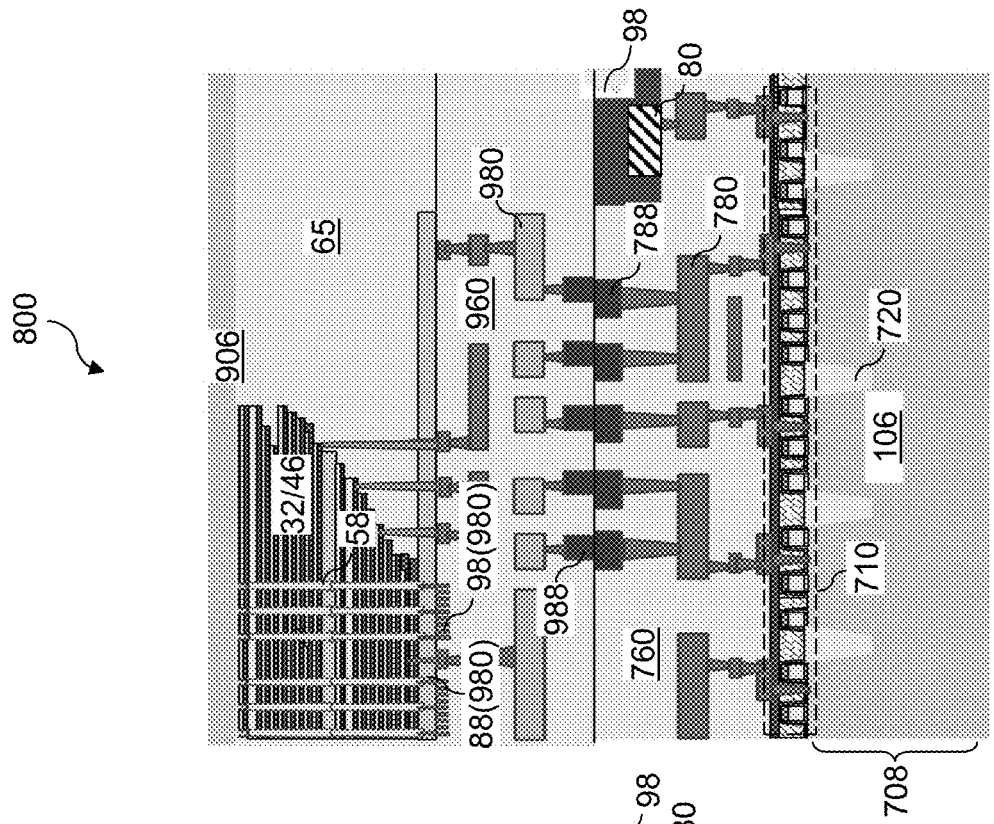
FIG. 8 is a vertical cross-sectional view of a first alternative configuration of the first exemplary structure according to an embodiment of the present disclosure.

FIG. 8 illustrates a first alternative configuration of the bonded assembly comprising a stack 800 of the first exemplary structure in which an outer sidewall of a first external bonding pad 80 is laterally recessed relative to most proximal sidewalls of the first semiconductor die 700 and the second semiconductor die 900, and a bonding connection wire 98 partially fills the first side cavity 97 formed by removal of a first sacrificial pad cover structure 96. This configuration is advantageous because it may reduce the stress of the bonding wire which will be described below.

FIG. 9A illustrates a second alternative configuration of the bonded assembly comprising a stack 800 of the first exemplary structure in which an outer sidewall of a first external bonding pad 80 is laterally recessed relative to most proximal sidewalls of the first semiconductor die 700 and the second semiconductor die 900, and a bonding connection wire 98 completely fills the first side cavity 97 formed by removal of a first sacrificial pad cover structure 96. FIG. 9B illustrates a third alternative configuration of the bonded assembly comprising a stack 800 of the first exemplary structure in which the bonding connection wire 98 does not extend over the inner sidewall of first external bonding pad 80.

Generally, each bonding connection wire 98 may be formed by injecting a bonding wire material into a respective first side cavity 97 directly on a respective first external bonding pad 80, and by continuously extracting the bonding wire material over the sidewall of the bonded assembly (e.g., over the sidewall of the stack 800), such as the sidewall of the first semiconductor die 700 and/or over the sidewall of the second semiconductor die 900.

FIGS. 10A-19B illustrate the processing steps of FIGS. 1-9 in more detail through a series of magnified views.

Figure 10B:
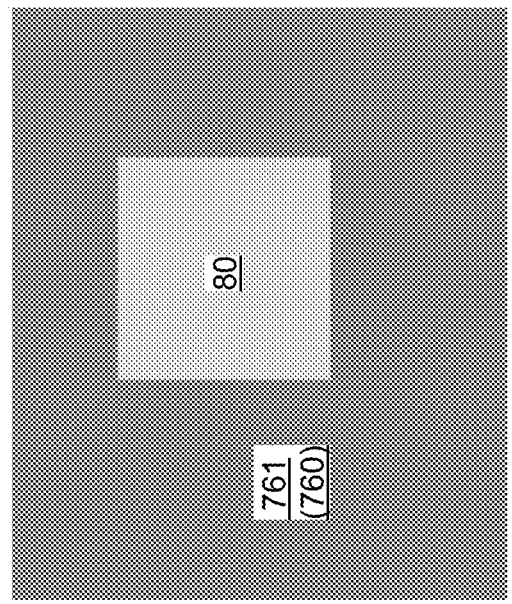
FIG. 10B is a top-down view of the region of the first semiconductor die of FIG. 10A.
Figure 10A:
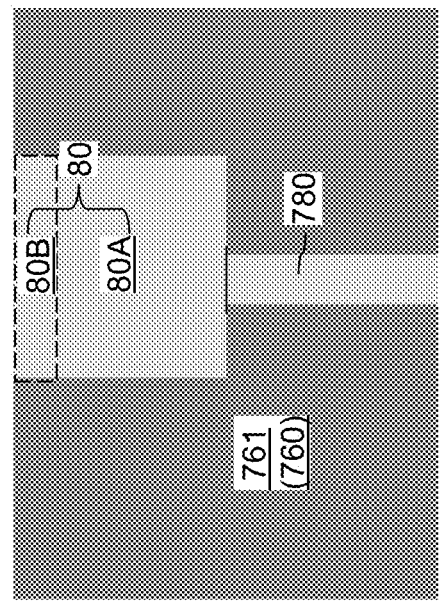
FIG. 10A is a vertical cross-sectional view of a region of the first semiconductor die after formation of an external bonding pad according to an embodiment of the present disclosure.

Referring to FIGS. 10A and 10B, a region of the first semiconductor die 700 is illustrated in a vertical cross-sectional view and in a top-down view, respectively, after formation of a first external bonding pad 80. Interconnect-level dielectric material layers 761 may be formed over the first semiconductor devices 710 on the first semiconductor substrate 106 illustrated in FIG. 1. The interconnect-level dielectric material layers 761 include a subset of layers within the first dielectric material layers 760 that excludes a pad-level dielectric material layer to be subsequently formed. The first metal interconnect structures 780 may be formed within the interconnect-level dielectric material layers 761. The first external bonding pads 80 may be formed concurrently with formation of a subset of the first metal interconnect structures 780, or may be formed in a separate processing step. In one embodiment, the first external bonding pads 80 may include at least one conductive material that is different from the materials of the first metal interconnect structures 780. In one embodiment, the first external bonding pads 80 may include at least one metallic material optimized for bonding with a bonding connection wire. For example, the first external bonding pads 80 may include a metal pad 80A (such as a copper pad or an aluminum pad) and an underbump metallurgy (UBM) stack 80B. An exemplary UBM stack 80B includes, from bottom to top, a bulk metal layer (such as a nickel layer) and a passivation metal layer such as a gold layer and/or a palladium layer having a thickness in a range from 100 nm to 3,000 nm.

Figure 11A:
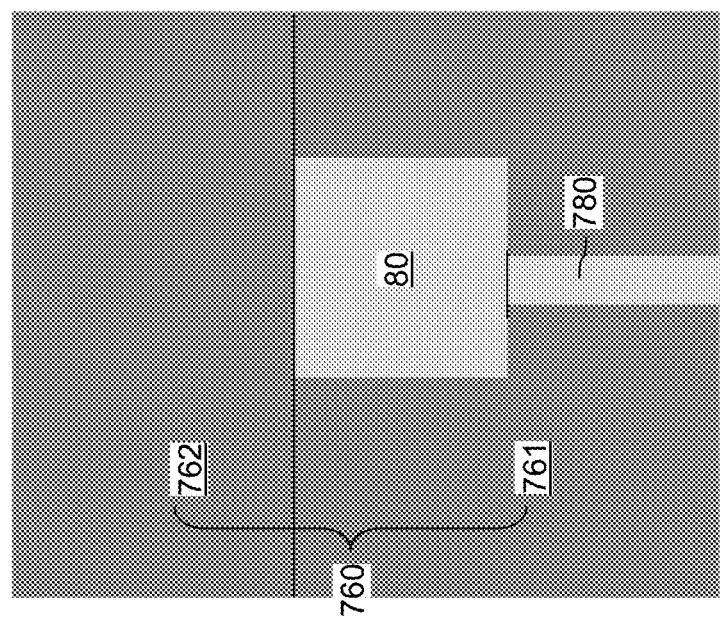
FIG. 11A is a vertical cross-sectional view of the region of the first semiconductor die after formation of a topmost insulating layer and bonding pads according to an embodiment of the present disclosure.
Figure 11B:
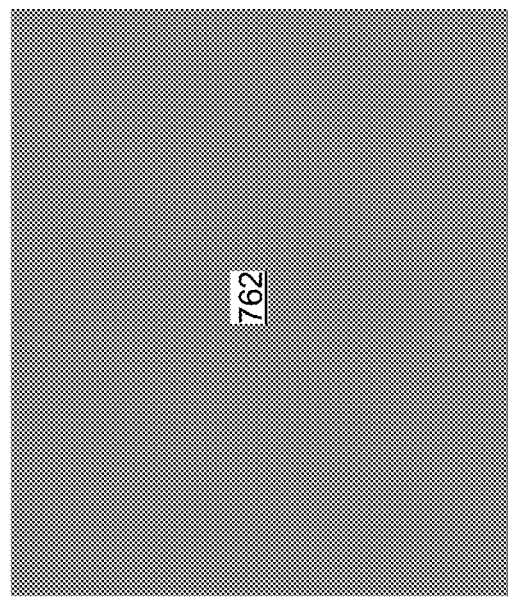
FIG. 11B is a top-down view of the region of the first semiconductor die of FIG. 11A.

Referring to FIGS. 11A and 11B, a pad-level dielectric material layer 762 may be formed over the interconnect-level dielectric material layers 761. The combination of the interconnect-level dielectric material layers 761 and the pad-level dielectric material layer 762 constitutes the first dielectric material layers 760. The various component layers of the first dielectric material layers 760 include a respective dielectric material such as silicon oxide, silicon nitride, or organosilicate glass. The thickness of the pad-level dielectric material layer 762 may be in a range from 400 nm to 8,000 nm, although lesser and greater thicknesses may also be used. The first bonding pads 788 may be formed on, or in, the pad-level dielectric material layer 762.

Figure 12B:
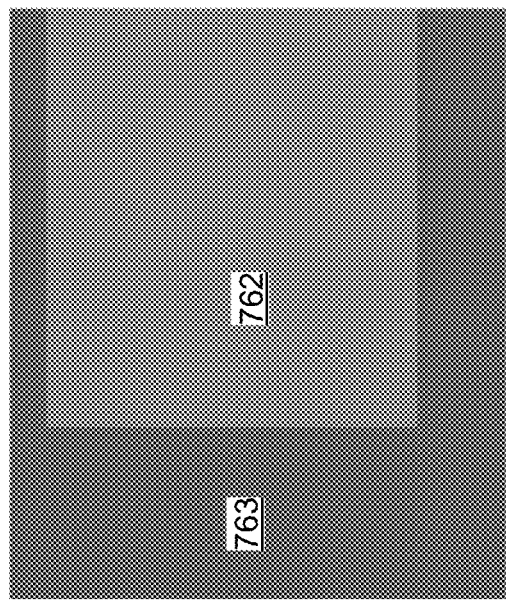
FIG. 12B is a top-down view of the region of the first semiconductor die of FIG. 12A.
Figure 12A:
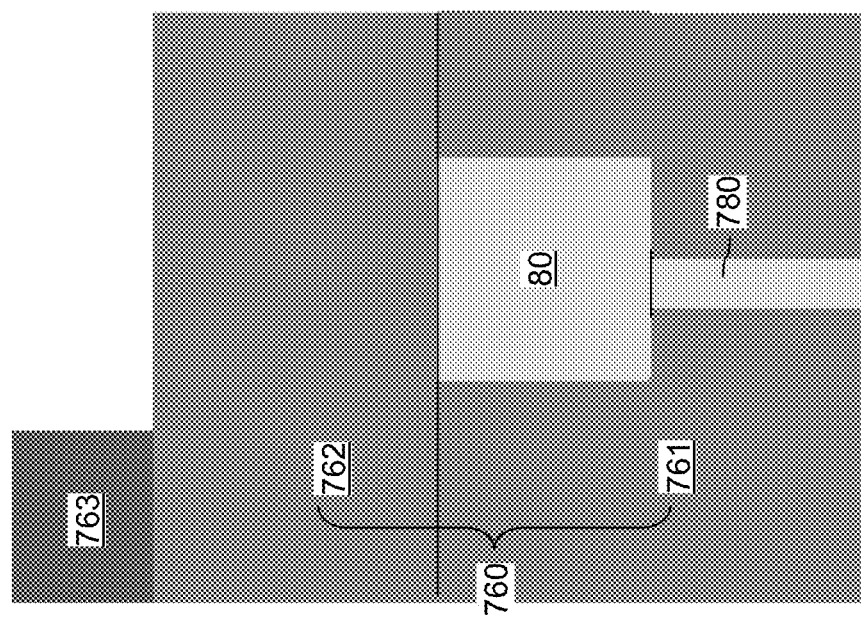
FIG. 12A is a vertical cross-sectional view of the region of the first semiconductor die after formation of a patterned photoresist layer according to an embodiment of the present disclosure.

Referring to FIGS. 12A and 12B, a photoresist layer 763 may be applied over the pad-level dielectric material layer 762, and may be lithographically patterned to form openings over areas of the first external bonding pads 80. In one embodiment, the shapes of the openings in the photoresist layer 763 may be selected such that the entire area of each first external bonding pad 80 is located entirely inside a periphery of an overlying opening in the photoresist layer 763. Each opening in the patterned photoresist layer 763 may have a periphery located outside of, and laterally enclosing, a periphery of an underlying first external bonding pad 80 in a plan view along a direction perpendicular to the top surfaces of the first external bonding pads 80, i.e., in the plan view along the vertical direction. A finite lateral offset may be provided between the periphery of each first external bonding pad 80 and the periphery of the overlying opening in the photoresist layer 763. All first bonding pads 788 may be covered by the photoresist layer 763.

Figure 13B:
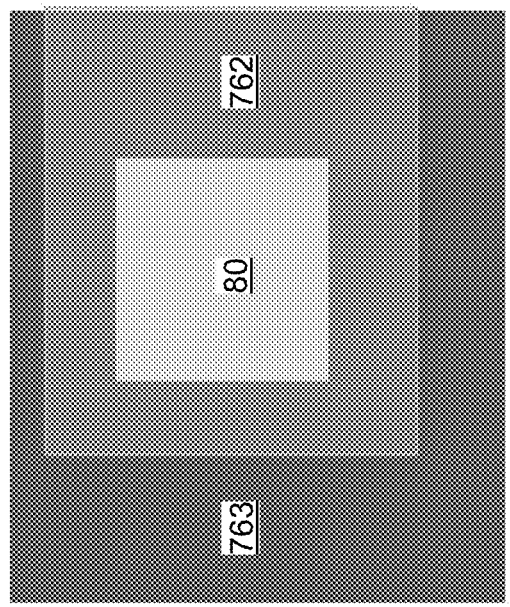
FIG. 13B is a top-down view of the region of the first semiconductor die of FIG. 13A.
Figure 13A:
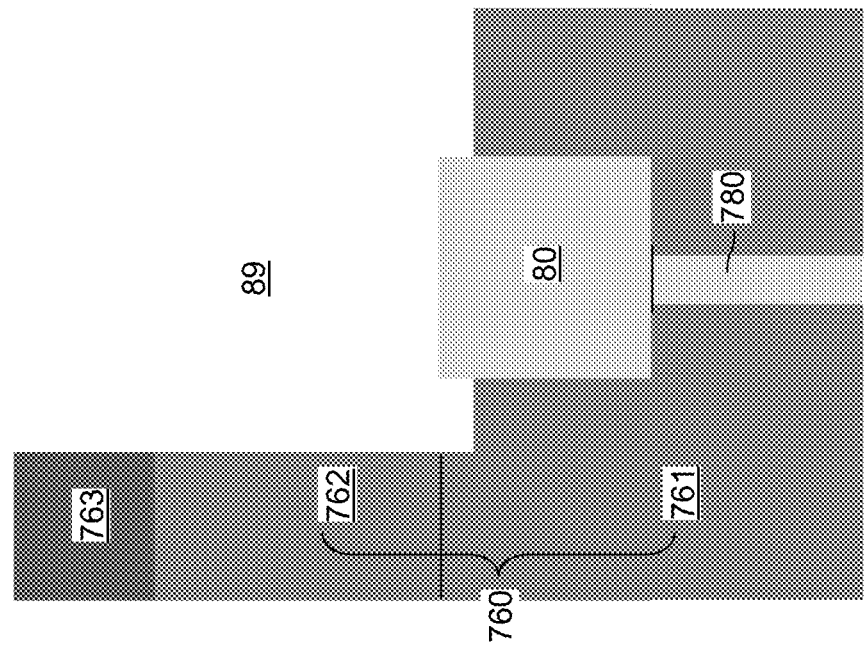
FIG. 13A is a vertical cross-sectional view of the region of the first semiconductor die after formation of a recess region according to an embodiment of the present disclosure.

Referring to FIGS. 13A and 13B, an anisotropic etch process may be performed to transfer the pattern of the openings in the photoresist layer 763 through the entire thickness of the pad-level dielectric material layer 762. Portions of the pad-level dielectric material layer 762 may be vertically recessed around each first external bonding pad 80 such that the front-side surface of each first external bonding pad 80 is physically exposed. An entire top surface of each first external bonding pad 80 may be physically exposed by the anisotropic etch process.

Optionally, the anisotropic etch process may be extended after the top surfaces of the first external bonding pads 80 are physically exposed. The chemistry of the anisotropic etch process may be selected such that the anisotropic etch process etches the material(s) of the interconnect-level dielectric material layers 761 selective to the material of the first external bonding pads 80. A top surface of the interconnect-level dielectric material layers 761 may be vertically recessed relative to the top surfaces of the first external bonding pads 80. In this case, the pad-level dielectric material layer 762 is anisotropically etched within the areas of the openings in the patterned photoresist layer 763 such that sidewalls of the first external bonding pads 80 are physically exposed. A recess region 89 may be formed over each first external bonding pad 80. Each recess region 89 may have an area of the overlying opening in the photoresist layer 763. The photoresist layer 763 may be subsequently removed, for example, by ashing or by an organic solvent to avoid oxidation.

Figure 14B:
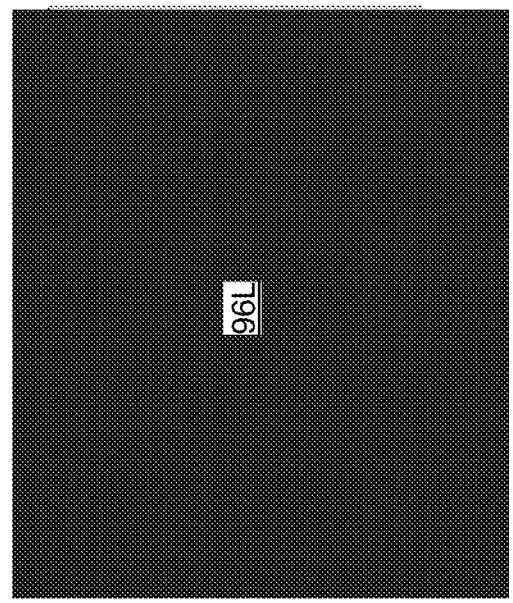
FIG. 14B is a top-down view of the region of the first semiconductor die of FIG. 14A.
Figure 14A:
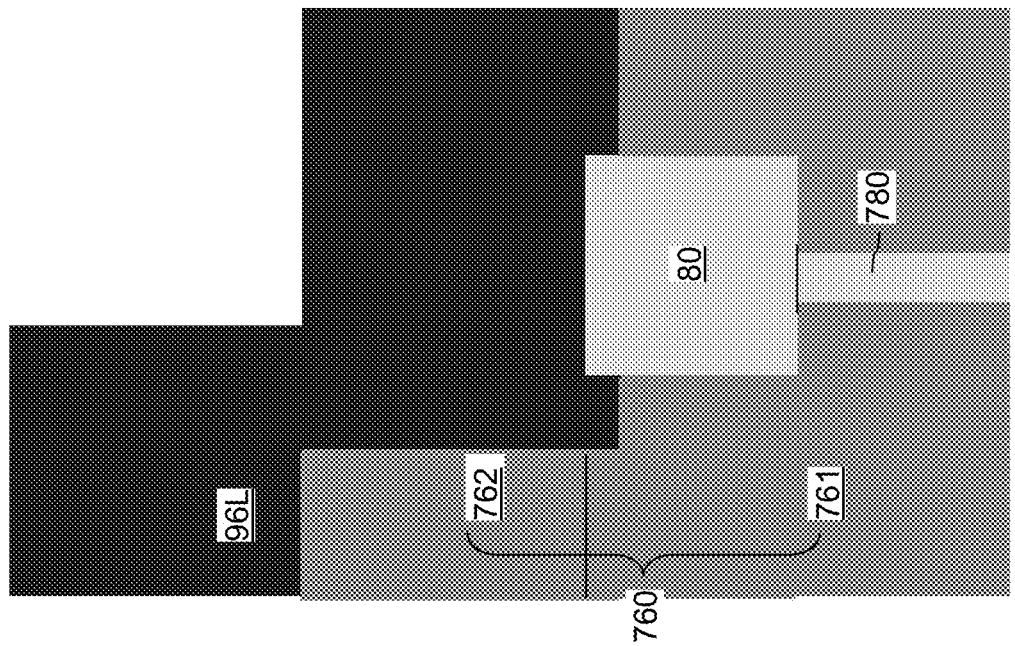
FIG. 14A is a vertical cross-sectional view of the region of the first semiconductor die after deposition of a sacrificial fill material layer according to an embodiment of the present disclosure.

Referring to FIGS. 14A and 14B, a sacrificial fill material layer 96L may be deposited in the recess regions 89 and over the first dielectric material layers 760. The sacrificial fill material layer 96L includes a material that may be subsequently removed selective to materials of the first dielectric material layers 760 and the first external bonding pads 80. In one embodiment, the sacrificial fill material layer 96L may include a polymer material layer that may be subsequently dissolved selective to the materials of the first dielectric material layers 760 and the first external bonding pads 80. For example, the sacrificial fill material layer 96L may include polyimide. Alternatively, the sacrificial fill material layer 96L may include a material that may be removed selective to the materials of the first dielectric material layers 760 and the first external bonding pads 80 by ashing. For example, the sacrificial fill material layer 96L may include amorphous carbon or a carbon-based material. The thickness of the sacrificial fill material layer 96L may be greater than the maximum depth of the recess regions 89 so that the recess regions 89 are completely filled.

Figure 15A:
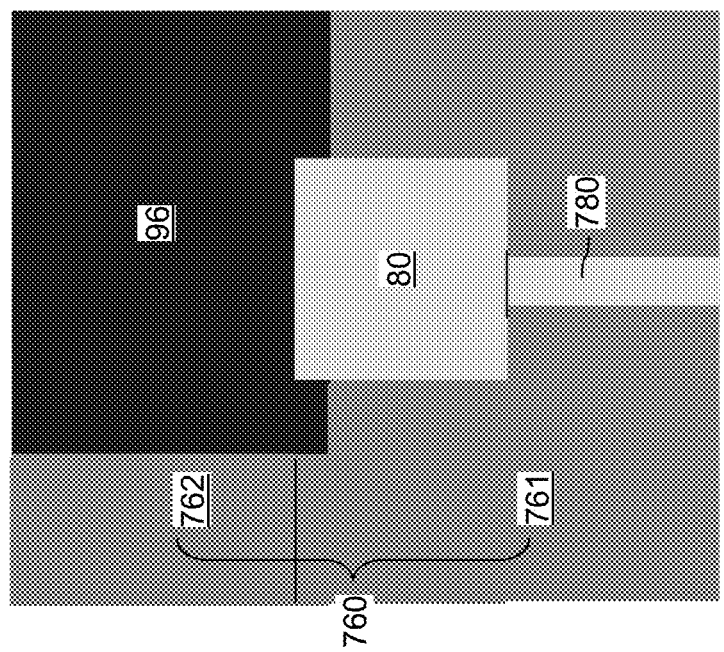
FIG. 15A is a vertical cross-sectional view of the region of the first semiconductor die after formation of a sacrificial pad cover structure according to an embodiment of the present disclosure.
Figure 15B:
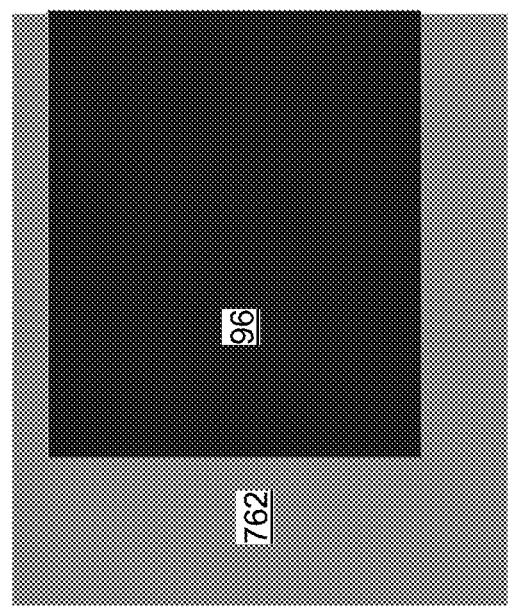
FIG. 15B is a top-down view of the region of the first semiconductor die of FIG. 15A.

Referring to FIGS. 15A and 15B, excess portions of the sacrificial fill material overlying the horizontal plane including the top surfaces of the first dielectric material layers 760 and the first bonding pads 788 may be removed by a planarization process such as chemical mechanical planarization. Each remaining portion of the sacrificial fill material that fills the recess regions 89 constitutes a sacrificial pad cover structure 96. Each first external bonding pad 80 may be covered by a respective sacrificial pad cover structure 96 having a top surface that is coplanar with the top surface of the first dielectric material layers 760 and physically exposed front-side surfaces of the first bonding pads 788. The first semiconductor die 700 of FIG. 1 may be provided upon completion of the processing steps of FIGS. 15A and 15B.

Figure 16B:
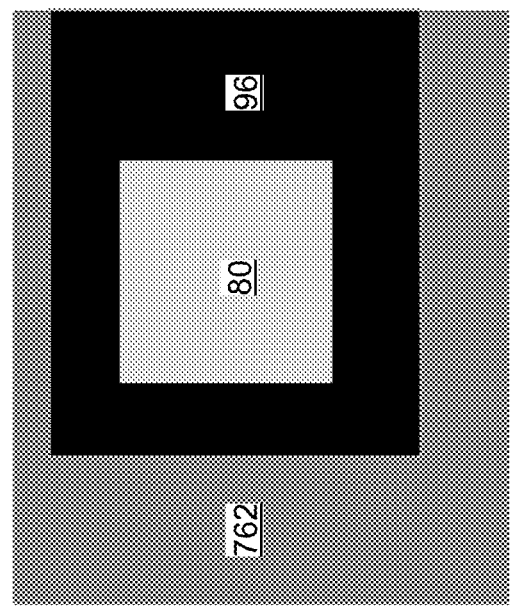
FIG. 16B is a horizontal cross-sectional view along the horizontal plane B-B' of the region of FIG. 16A.
Figure 16A:
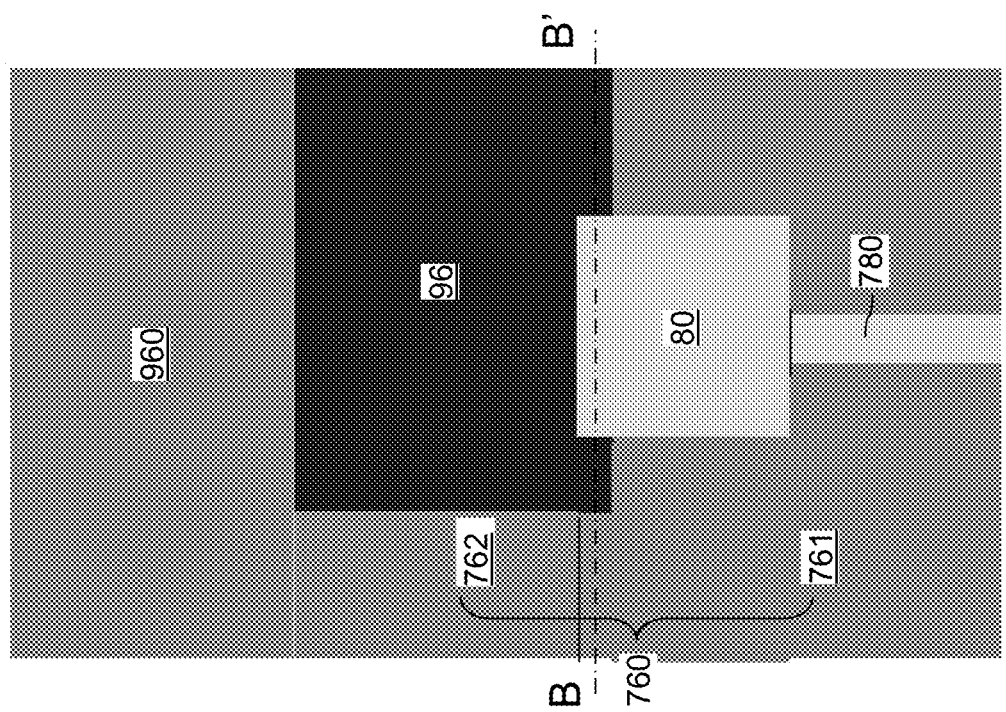
FIG. 16A is a vertical cross-sectional view of a region of the first exemplary structure of FIG. 3.

Referring to FIGS. 16A and 16B, the processing steps of FIGS. 3 and 4 may be performed to form a bonded assembly of the first semiconductor die 700 and the second semiconductor die 900, and optionally to thin the second semiconductor substrate 906 and/or to thin the first semiconductor substrate 106.

Figure 17B:
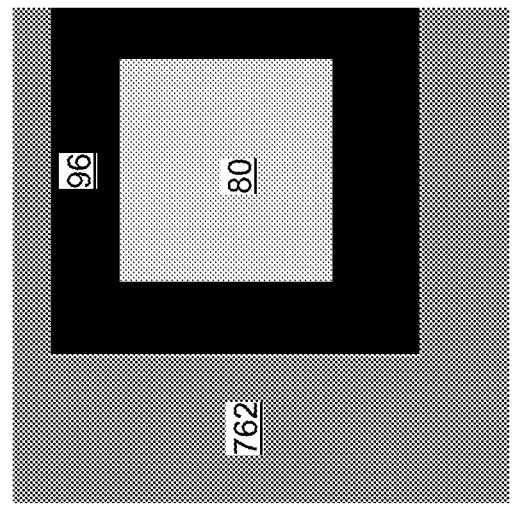
FIG. 17B is a horizontal cross-sectional view along the horizontal plane B-B' of the region of FIG. 17A.
Figure 17A:
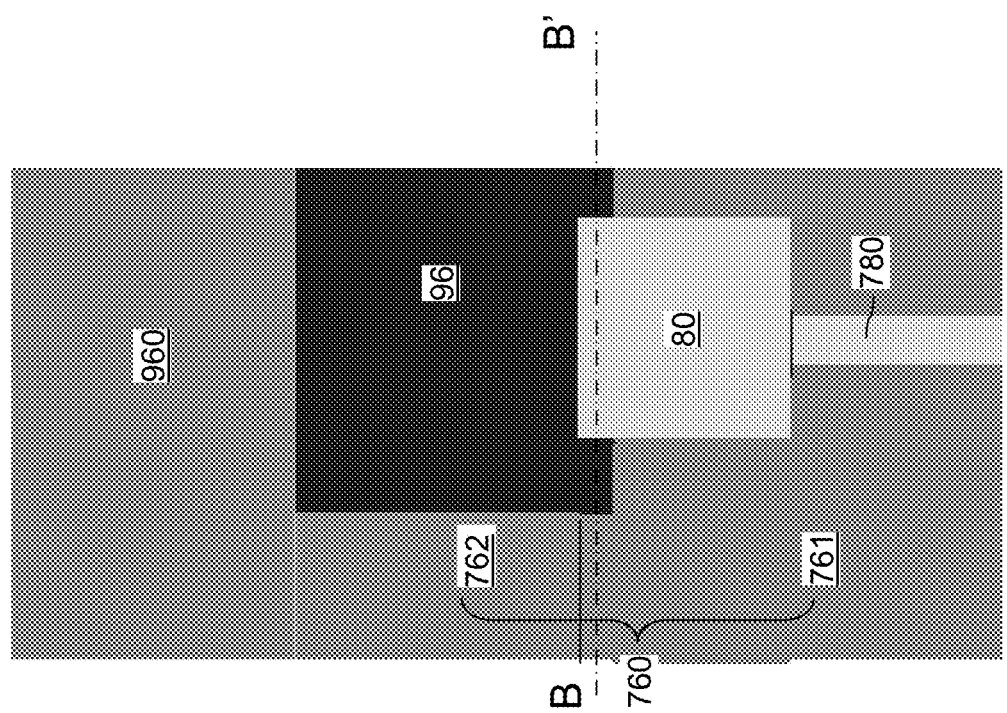
FIG. 17A is a vertical cross-sectional view of a region of the first exemplary structure of FIG. 5.

Referring to FIGS. 17A and 17B, sidewalls of the bonded assembly may be optionally thinned on any, or each, side that includes first external bonding pads 80. A sidewall of each of the sacrificial pad cover structures 96 may be physically exposed. The first external pad structures 80, and thus, the sacrificial pad cover structures 96, may be provided on one side, two sides, three-sides, or four sides of the first semiconductor die 700. Each of the first external bonding pads 80 may, or may not, have a physically exposed sidewall depending on the extent of thinning of the sidewall(s) of the bonded assembly of the first semiconductor die 700 and the second semiconductor die 900. In this step, the dicing saw (e.g., laser saw) does not cut into the metal of the first external bonding pads 80. The decreases the amount of metal dust generated during dicing, which decreases the chance of a short circuit caused by the metal dust. Thus, in one embodiment, the first external bonding pads 80 may be laterally spaced apart by distance from the dicing line to reduce or avoid generation of the metal dust during dicing.

Figure 18B:
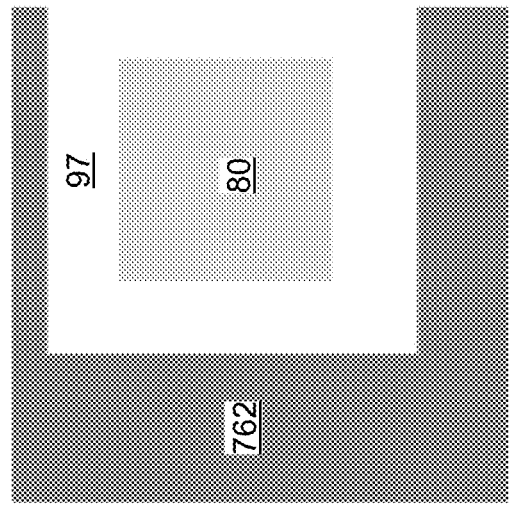
FIG. 18B is a horizontal cross-sectional view along the horizontal plane B-B' of the region of FIG. 18A.
Figure 18A:
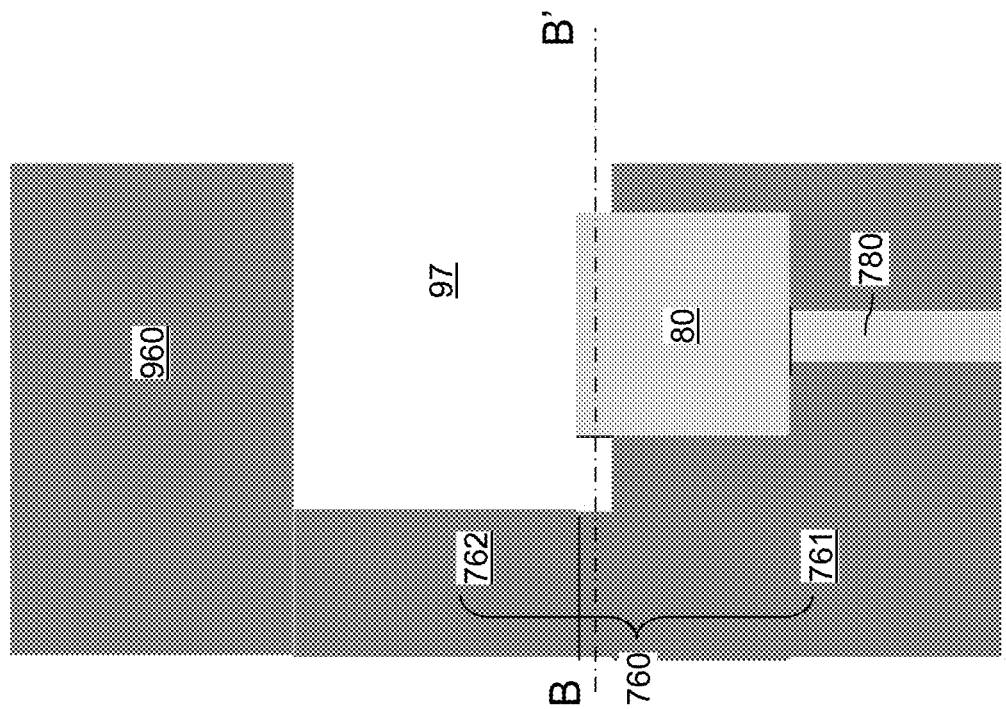
FIG. 18A is a vertical cross-sectional view of a region of the first exemplary structure of FIG. 6.

Referring to FIGS. 18A and 18B, the sacrificial pad cover structures 96 may be removed selective to the materials of the first dielectric material layers 760, the second dielectric material layers 960, and the first external bonding pads 80. For example, if the sacrificial pad cover structures 96 include polyimide or another polymer material that may be dissolved in an organic solvent, removal of the sacrificial pad cover structures 96 may be performed by dissolving the sacrificial pad cover structures 96 in such an organic solvent. Alternatively, the sacrificial pad cover structures 96 may be removed by ashing.

Referring to FIGS. 19A and 19B, a metallic bonding material may be applied into each of the first side cavities 97, and may be subsequently extracted to form bonding connection wires 98. The bonding connection wires 98 may continuously extend to another semiconductor die (which may, or may not, be the second semiconductor die 900) and/or to another substrate such as a packaging substrate (not shown), and may be bonded to a respective external bonding pad located on the semiconductor die or the substrate.

The bonding connection wire 98 may include a protrusion portion 98P that may protrude into an opening through the sidewall of the first semiconductor die 700 and contacts a first external bonding pad 80, and an inter-die connection portion 981 that is connected to the protrusion portion 98P. The protrusion portion 98P contacts a front-side surface of the first external bonding pad 80 that faces toward the second semiconductor die 900. The protrusion portion 98P contacts a proximal sidewall 8P of the first external bonding pad 80 that faces toward the inter-die connection portion 981, and contacts a distal sidewall 8D of the first external bonding pad 80 that faces away from the inter-die connection portion 981. As shown in the cross section of FIG. 19, the bonding connection wire 98 may surround the first external bonding pad 80 in order to anchor the bonding connection wire 98 in a secure manner both over and around the first external bonding pad 80. The secure anchoring of the bonding connection wire 98 may provide an anti-peeling feature to the bonding wire 98.

Figure 20:
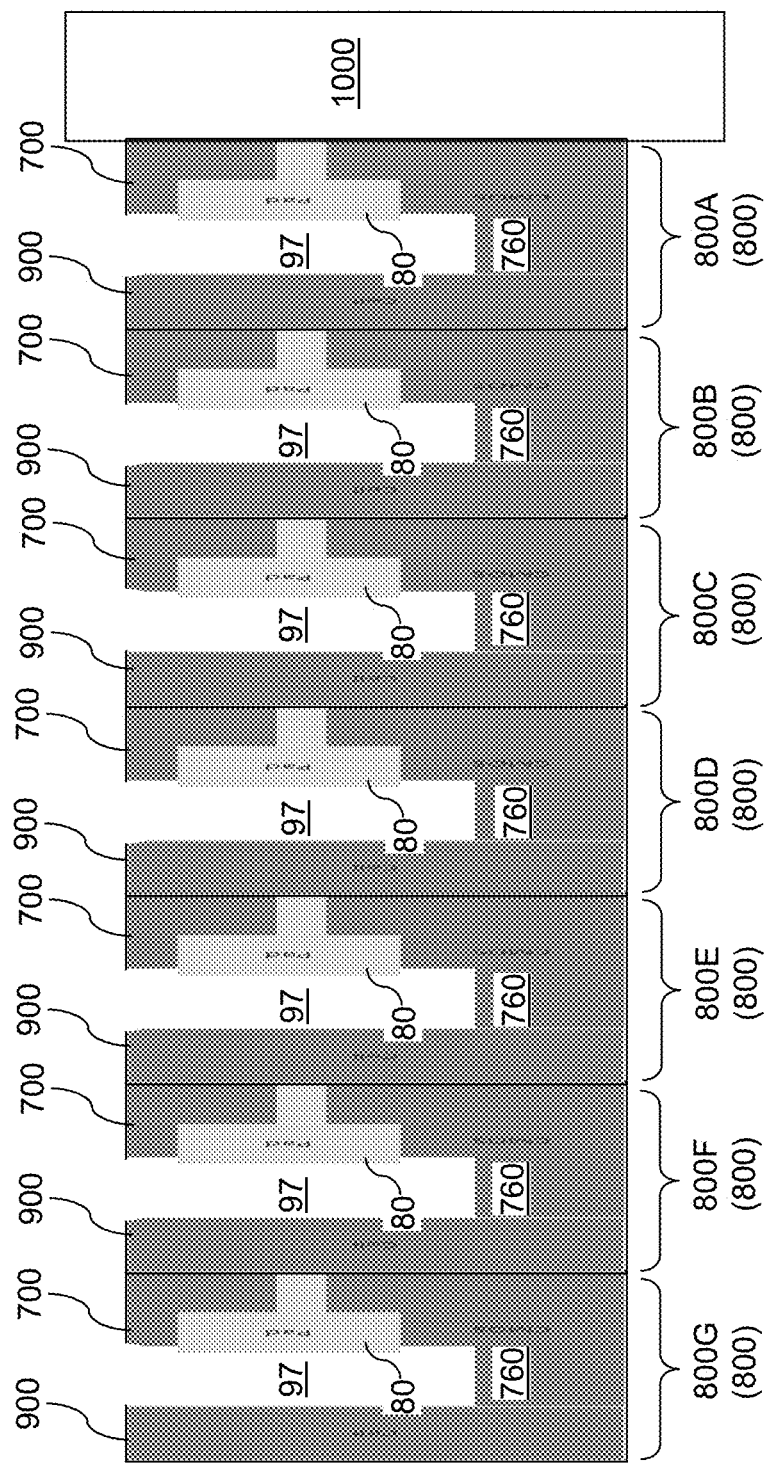
FIG. 20 is a cross-sectional view of a second exemplary structure including a plurality of bonded semiconductor dies at the processing steps of FIGS. 9A, 9B, 18A, and 18B according to an embodiment of the present disclosure.

Referring to FIG. 20, a second exemplary structure including an assembly 1100 containing plurality of the stacks 800 is illustrated at the processing steps of FIGS. 9A, 9B, 18A, and 18B. The assembly 1100 of the second exemplary structure of FIG. 20 may be formed by stacking multiple stacks 800 described above and optionally a packaging substrate 1000. The stacks 800 may be connected to each other by glue and/or a mechanical fastener to form the assembly 1100. Each of the multiple stacks 800 includes a respective set of external bonding pads 80 and a respective set of side cavities in the same manner as the first semiconductor die 700 illustrated in FIGS. 6, 18A, and 18B. The multiple stacks 800 may comprise memory dies, logic dies (such as a support die for a memory die) or a combination of memory and logic dies. For example, each stack 800 may comprise a memory die 900 bonded to a logic support die 700 as described in the prior embodiments. For example, at least two stacks, such as three to twenty stacks, for example seven stacks 800 (e.g., 800A, 800B, 800C, 800D, 800E, 800F and 800G) may be stacked with a respective major surface of one stack (e.g., 800A) contacting a major surface on an adjacent stack (e.g., 800B) and with the outer sidewalls exposed.

The processing steps of FIGS. 9A, 9B, 18A, and 18B may be performed to form side cavities 97 within each of the stacks 800, such that the side cavities 97 are exposed before or after stacking the stacks 800 together. A packaging substrate 1000 may be attached to the first stack 800A. The packaging substrate 1000 may be any packaging substrate known in the art. If used, the packaging substrate 1000 may be a laminate packaging substrate or a ceramic packaging substrate. Each stack 800 within the assembly includes a respective set of external bonding pads 80 that are physically exposed to a respective set of side cavities 97.

Figure 21:
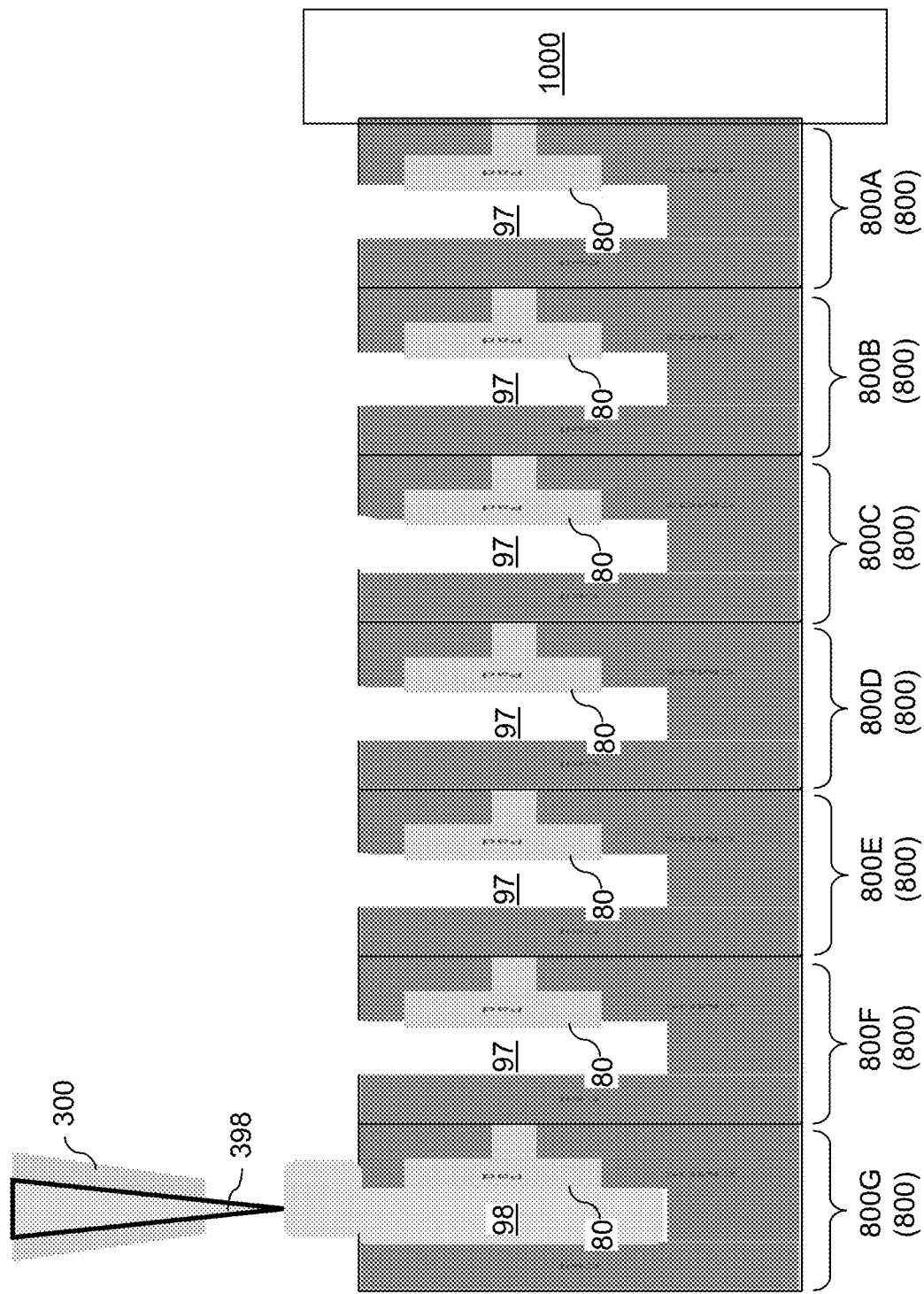
FIGS. 21-24 are sequential cross-sectional views of the second exemplary structure including a plurality of bonded semiconductor dies at the processing steps of FIGS. 7-9, 19A, and 19B according to an embodiment of the present disclosure.

Referring to FIG. 21, a wire extraction apparatus 300 may be used to inject a bonding wire material into a side cavity 97 located on a first external bonding pad 80 to which a bonding connection wire 98 is to be connected. In one embodiment, the bonding wire material may extrude through a tip 398 of the wire extraction apparatus 300 into the side cavity 97.

Figure 22:
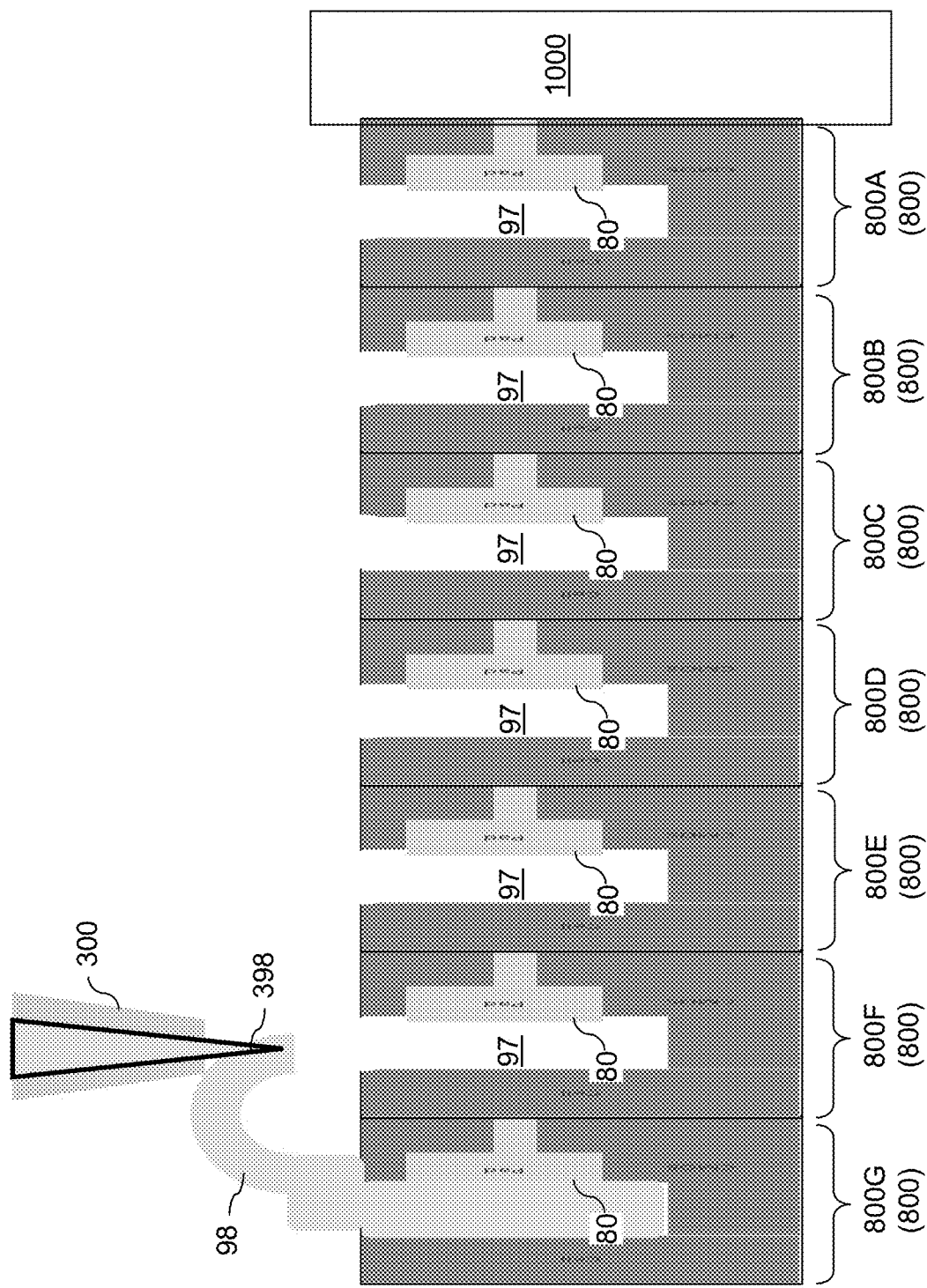

Referring to FIG. 22, the bonding wire material is continuously extracted over a sidewall of the stack 800 (e.g., the support die 700 of stack 800G) that forms an initial portion of the bonding connection wire toward a next side cavity 97 that borders a next external bonding pad 80 to be subsequently bonded.

Figure 23:
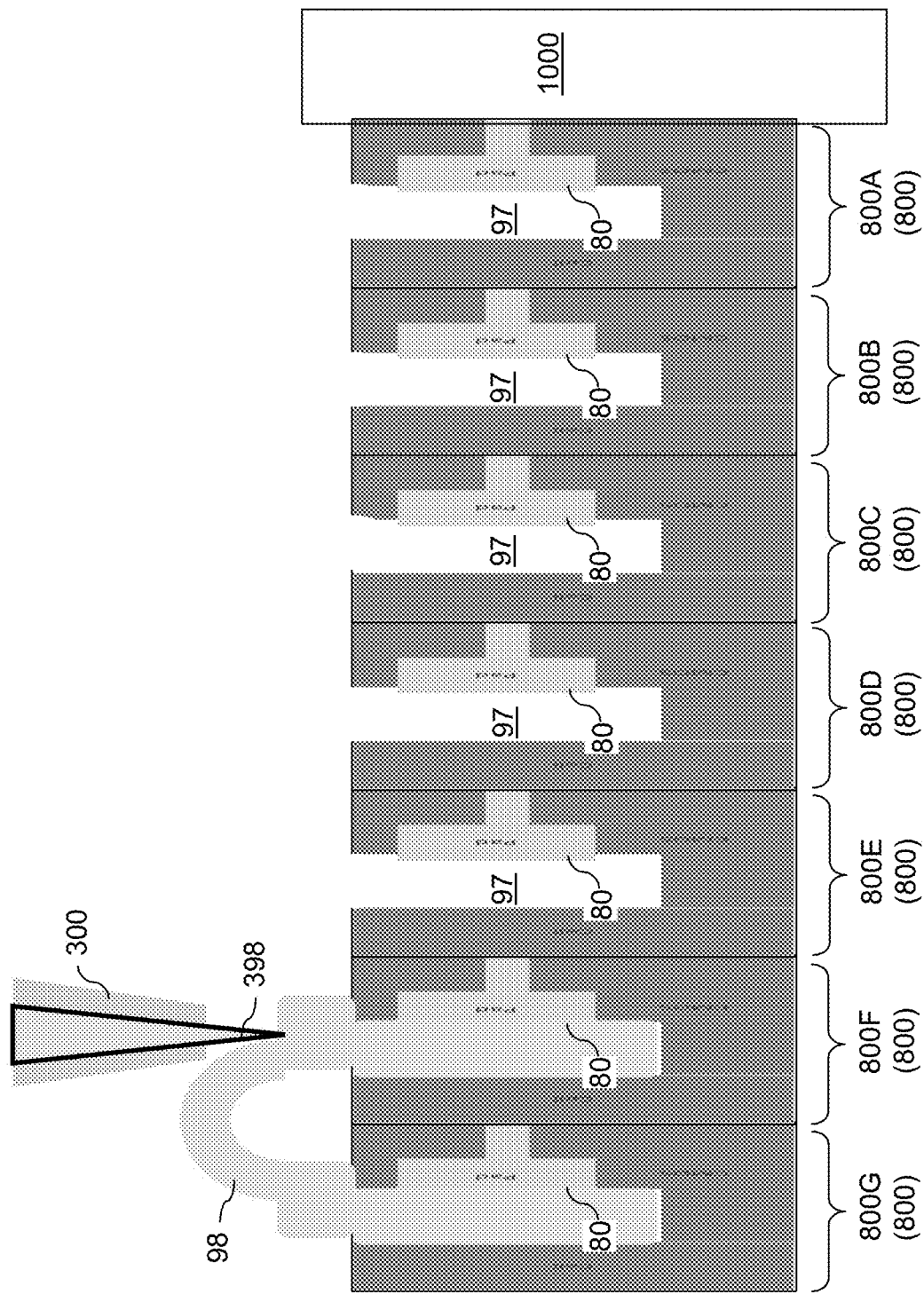

Referring to FIG. 23, the bonding wire material is continuously extracted to form a next portion that fills a second side cavity 97 and contacts a second external bonding pad 80 in the next semiconductor die 700 of the next stack 800F.

Figure 24:
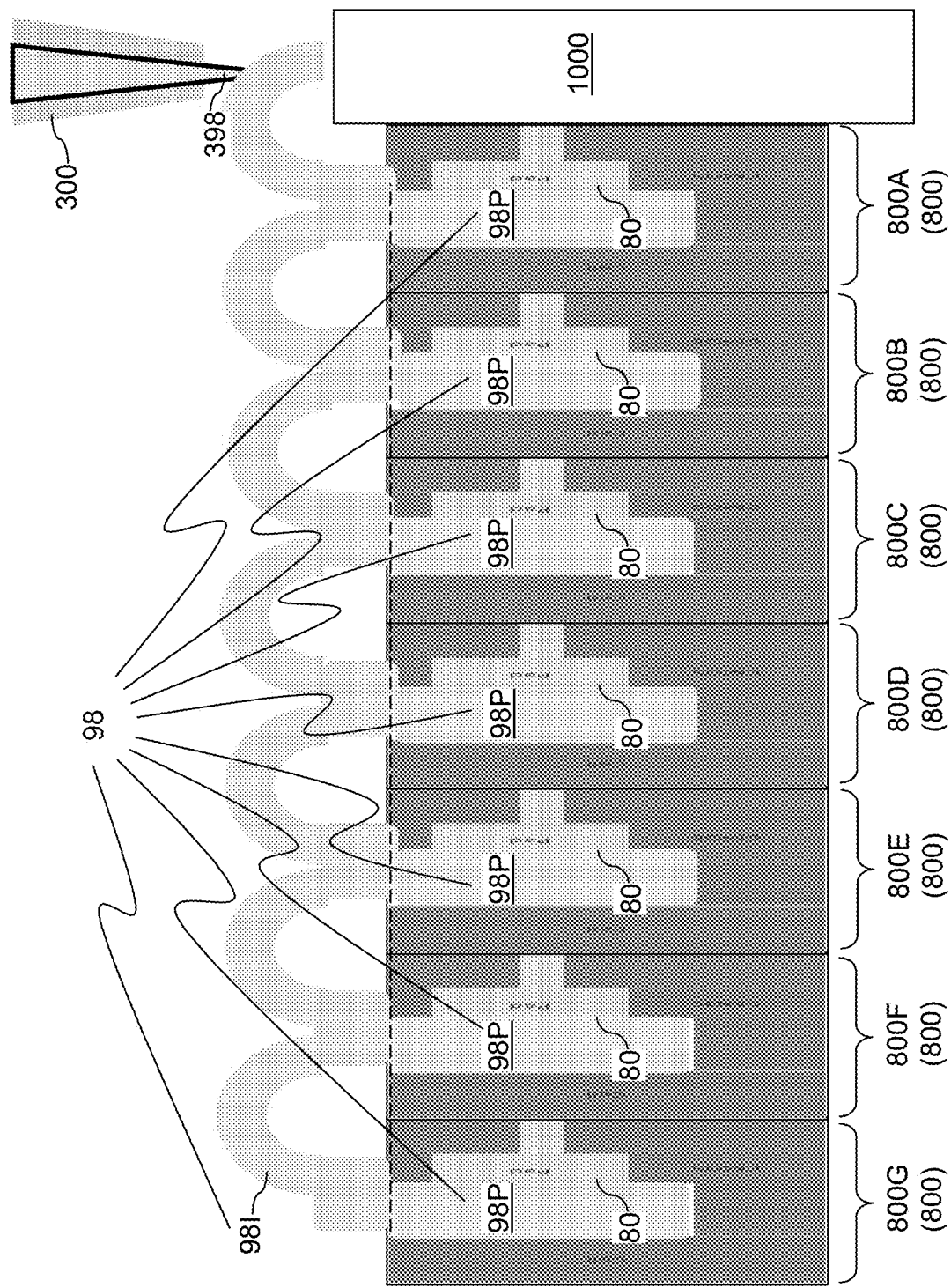

Referring to FIG. 24, the processing steps of FIG. 23 may be repeated until the bonding connection wire 98 continuously extends across all of the stacks 800 and optionally to the packaging substrate 1000, and provides electrical connection across a set of external bonding pads 80 that are distributed across multiple stacks 800 and optionally in the packaging substrate 1000. In one embodiment, the bonding connection wire 98 may be formed with loops so that the bonding connection wire 98 does not contact sidewalls of the stacks 800 outside regions in which the bonding connection wire 98 protrudes into side cavities of the stacks 800.

Referring to FIG. 25, an alternative embodiment of the second exemplary structure is illustrated, in which a bonding connection wire 98 is formed directly on insulating sidewalls of the stacks 800.

Figure 26B:
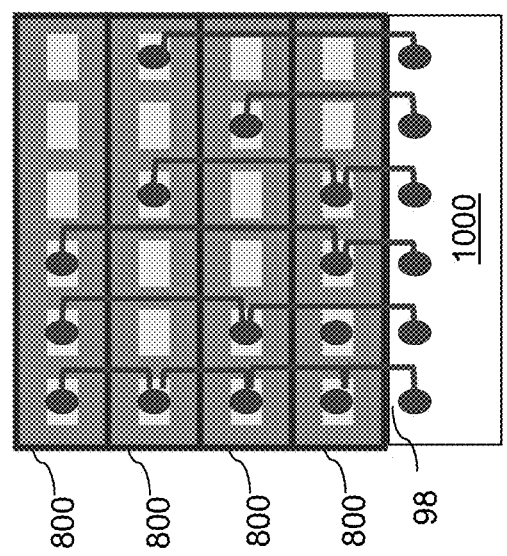
FIG. 26B is a side view of the structure of FIG. 26A.
Figure 26A:
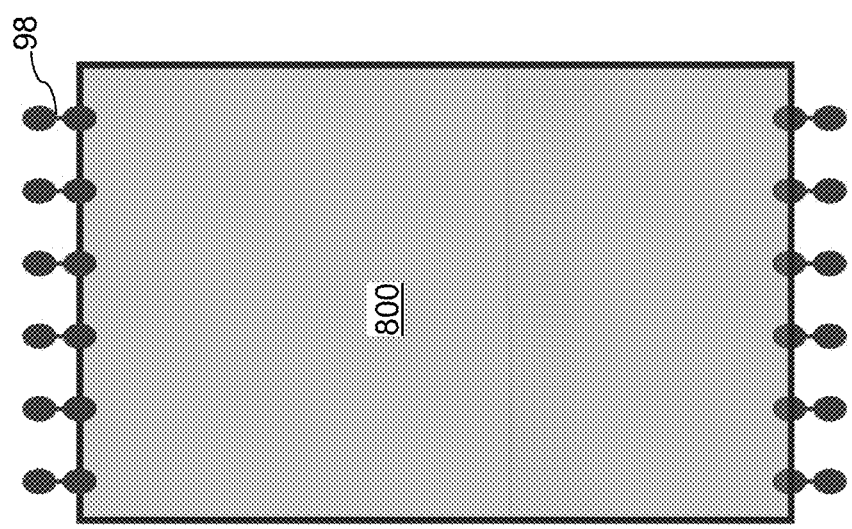
FIG. 26A is a top-down view of a first exemplary layout of bonding connection wires according to an embodiment of the present disclosure.

Referring to FIGS. 26A and 26B, multiple bonding connection wires 98 may be used to provide electrical connections across multiple stacks 800. At least one, and/or each, of the bonding connection wires 98 may provide electrical connection across a respective set of external bonding pads 80 located in multiple stacks 800.

Figure 27B:
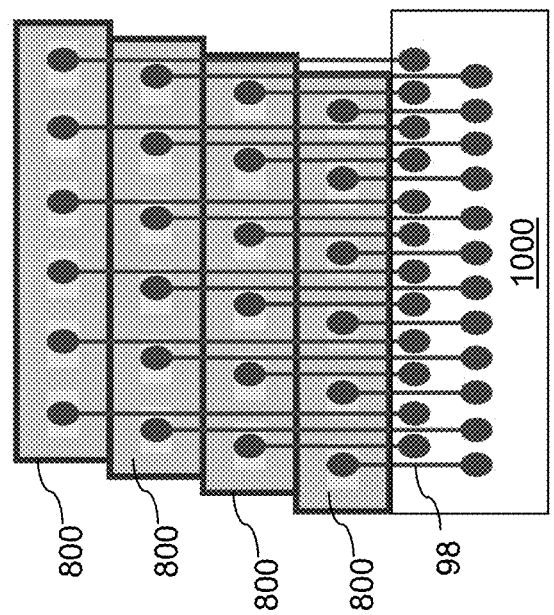
FIG. 27B is a side view of the structure of FIG. 27A.
Figure 27A:
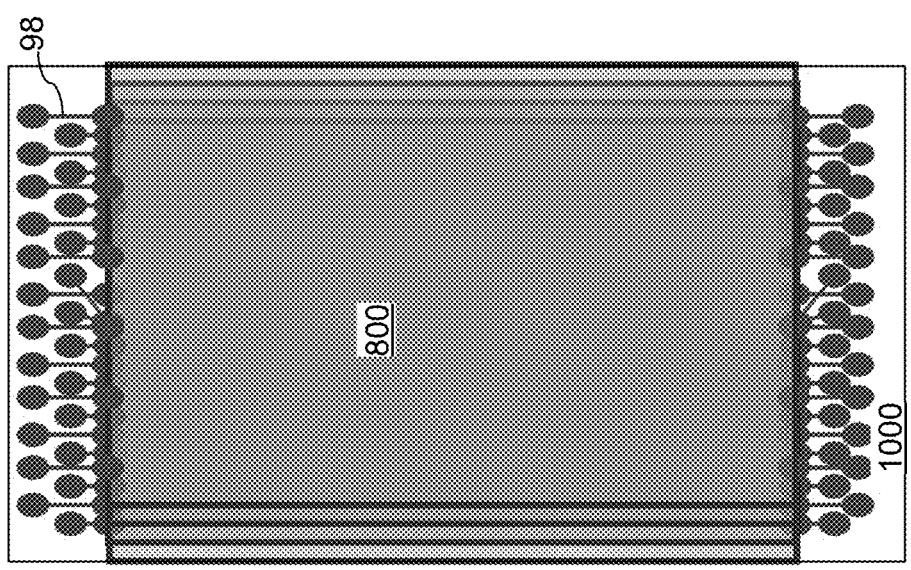
FIG. 27A is a top-down view of a second exemplary layout of bonding connection wires according to an embodiment of the present disclosure.

Referring to FIGS. 27A and 27B, an alternative layout for the bonding connection wires 98 is illustrated. In this case, at least one, and/or each, of the multiple bonding connection wires 98 may provide electrical connection between a single external bonding pad 80 on one of the multiple stacks 800 and another external bonding pad located on another structure such as a packaging substrate 1000.

Referring to all drawings and according to various embodiments of the present disclosure, a bonded assembly is provided, which comprises: a stack 800 (e.g., a first stack 800A) containing at least a first semiconductor die 700 bonded to a second semiconductor die 900 along a stacking direction, first external bonding pads 80 formed within the first semiconductor die 700, and bonding connection wires 98. Each of the bonding connection wires 98 extends over a sidewall of the first semiconductor die 700 and protrudes into the first semiconductor die 700 through the sidewall of the first semiconductor die 700 to contact a respective one of the first external bonding pads 80. A used herein, a stacking direction refers to the direction that is perpendicular to a bonding interface between two semiconductor dies.

In one embodiment, the first semiconductor die 700 comprises front-side bonding pads 788 having respective planar surfaces that are perpendicular to the stacking direction, the second semiconductor die 900 comprises backside bonding pads 988 having respective planar surfaces that are perpendicular to the stacking direction, and the backside bonding pads are bonded to the front-side bonding pads.

In one embodiment, each of the bonding connection wires 98 comprises: an inter-die connection portion 981 located outside of the first semiconductor die 700 and extends along the stacking direction over the sidewall of the first semiconductor die 700; and a first protrusion portion 98P that protrudes into an opening through the sidewall of the first semiconductor die 700 and contacts the respective one of the first external bonding pads 90.

In one embodiment, the first protrusion portion 98P comprises a first planar surface that contacts a top surface (which may be a surface of a UBM stack 80B) of the respective one of the first external bonding pads 80 that is perpendicular to the stacking direction, and a second planar surface that is spaced from the first planar surface by a uniform distance and contacts a planar dielectric surface of the second semiconductor die 900.

In one embodiment, the second planar surface may be within a same two-dimensional plane as bonding surfaces of the front-side bonding pads 788; and the top surface of the respective one of the first external bonding pads 80 that is perpendicular to the stacking direction is offset from a plane including bonding surfaces of the front-side bonding pads 788 along the stacking direction by a thickness of a segment of the first protrusion portion 98P of the bonding connection wire 98.

In one embodiment, the bonded assembly comprises second external bonding pads 80 formed within a second stack 800B. Each of the bonding connection wires 98 provides an electrical connection between the respective one of the first external bonding pads 80 and a respective one of the second external bonding pads 80 by extending over the sidewalls of the first stack 800A and second stack 800B, and protrudes into the second stack 800B to contact a respective one of the second external bonding pads 80.

In one embodiment shown in FIG. 24, each of the bonding connection wires 98 comprises a second protrusion portion 98P that may protrude into an opening through the sidewall of the second stack 800B and contacts the respective one of the second external bonding pads 80.

In one embodiment, the first protrusion portion 98P may contact a front-side surface of the respective one of the first external bonding pads 80 that faces toward the second stack 800B, and the second protrusion portion 98P may contact a front-side surface of the respective one of the second external bonding pads 80 that faces away from the first stack 800A.

In one embodiment, the first protrusion portion 98P may contact a proximal sidewall 8P of the respective one of the first external bonding pads 80 that faces toward the inter-die connection portion 98I; and the second protrusion portion 98P may contact a proximal sidewall 8P of the respective one of the second external bonding pads 80 that faces toward the inter-die connection portion 98I.

In one embodiment shown in FIG. 19D, the first protrusion portion 98P may contact a distal sidewall 8D of the respective one of the first external bonding pads 80 that faces away from the inter-die connection portion 98I; and the second protrusion portion 98P may contact a distal sidewall 8D of the respective one of the second external bonding pads 80 that faces sway from the inter-die connection portion 98I.

In one embodiment, the inter-die connection portion 98I continuously extends on the outer sidewall of the first stack 800A and on the outer sidewall of the second stack 800B between the first protrusion portion 98P and the second protrusion portion 98P as illustrated in FIG. 25.

In one embodiment, the first external bonding pads 80 are spaced from the sidewall of the first semiconductor die 700 located in a stack 800 by a lateral offset distance as illustrated in FIGS. 8, 9, 24, and 25.

In one embodiment, the first external bonding pads 80 may be physically exposed and have sidewalls that are within a same two-dimensional plane as the sidewall of the first semiconductor die 700 as illustrated in FIG. 7. The second exemplary structures of FIGS. 24 and 25 may be modified to provide this feature.

In one embodiment, the first external bonding pads 80 may be offset along the stacking direction from the second semiconductor die 900 in FIGS. 7-9B by a greater vertical offset distance than backside surfaces of the front-side bonding pads are from the second semiconductor die 900.

In one embodiment, the bonded assembly comprises a packaging substrate 1000 attached to the first stack 800A, wherein the bonding connection wires 98 may be bonded to bonding pads of the packaging substrate 1000 by wire bonding.

The various structures and methods of the embodiments of the present disclosure may be used to provide electrical connections using sidewall surfaces of semiconductor dies in a bonded assembly. The die size may be reduced since the bonding connection wire hook up area does not have to extend outward from the adjacent stack 800. Furthermore, expensive through silicon vias (TSVs) may be omitted. The protrusion portions 98P of the bonding connection wires 98 may contact sidewalls (8P, 8D) of the external bonding pads to provide protection against slippage (i.e., pulling out) of the protrusion portions 98P from the side cavities. By using side surfaces of a bonded assembly, high density wiring connection may be provided over the bonded assembly without excessive limitations on the die size or the total number of dies that may be stacked in the bonded assembly.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly, comprising:
   a first stack comprising a first semiconductor die bonded to a second semiconductor die along a stacking direction,
   first external bonding pads formed within the first semiconductor die; and
   bonding connection wires, wherein each of the bonding connection wires extends over a sidewall of the first semiconductor die and protrudes into the first semiconductor die through the sidewall of the first semiconductor die to contact a respective one of the first external bonding pads.

2. The bonded assembly of claim 1, wherein:
   the first semiconductor die comprises front-side bonding pads having respective planar surfaces that are perpendicular to the stacking direction;
   the second semiconductor die comprises backside bonding pads having respective planar surfaces that are perpendicular to the stacking direction; and
   the backside bonding pads are bonded to the front-side bonding pads.

3. The bonded assembly of claim 2, wherein each of the bonding connection wires comprises:
an inter-die connection portion located outside of the first semiconductor die and extends along the stacking direction over the sidewall of the first semiconductor die; and
a first protrusion portion that protrudes into an opening through the sidewall of the first semiconductor die and contacts the respective one of the first external bonding pads.

4. The bonded assembly of claim 3, wherein:
the first protrusion portion comprises a first planar surface that contacts a top surface of the respective one of the first external bonding pads that is perpendicular to the stacking direction, and a second planar surface that is spaced from the first planar surface by a uniform distance;
the second planar surface is within a same two-dimensional plane as bonding surfaces of the front-side bonding pads; and
the top surface of the respective one of the first external bonding pads that is perpendicular to the stacking direction is offset from a plane including bonding surfaces of the front-side bonding pads along the stacking direction by a thickness of a segment of the first protrusion portion.

5. The bonded assembly of claim 3, further comprising second external bonding pads formed within a second stack of two bonded dies, wherein each of the bonding connection wires provides an electrical connection between the respective one of the first external bonding pads and a respective one of the second external bonding pads by extending over the sidewall of the first stack and over a sidewall of the stack, and protrudes into the second stack to contact a respective one of the second external bonding pads.

6. The bonded assembly of claim 5, wherein each of the bonding connection wires comprises a second protrusion portion that protrudes into an opening through the sidewall of the second stack and contacts the respective one of the second external bonding pads.

7. The bonded assembly of claim 6, wherein:
the first protrusion portion contacts a front-side surface of the respective one of the first external bonding pads that faces toward the second stack, and
the second protrusion portion contacts a front-side surface of the respective one of the second external bonding pads that faces away from the first stack.

8. The bonded assembly of claim 7, wherein:
the first protrusion portion contacts a proximal sidewall of the respective one of the first external bonding pads that faces toward the inter-die connection portion; and
the second protrusion portion contacts a proximal sidewall of the respective one of the second external bonding pads that faces toward the inter-die connection portion.

9. The bonded assembly of claim 8, wherein:
the first protrusion portion contacts a distal sidewall of the respective one of the first external bonding pads that faces away from the inter-die connection portion; and
the second protrusion portion contacts a distal sidewall of the respective one of the second external bonding pads that faces sway from the inter-die connection portion.

10. The bonded assembly of claim 6, wherein the inter-die connection portion continuously extends on an outer sidewall of the first stack and on an outer sidewall of the second stack between the first protrusion portion and the second protrusion portion.

11. The bonded assembly of claim 1, wherein the first external bonding pads are spaced from the sidewall of the first semiconductor die by a lateral offset distance.

12. The bonded assembly of claim 1, wherein the first external bonding pads are physically exposed and have sidewalls that are within a same two-dimensional plane as the sidewall of the first semiconductor die.

13. The bonded assembly of claim 1, wherein the first external bonding pads are offset along the stacking direction from the second semiconductor die by a greater vertical offset distance than backside surfaces of the front-side bonding pads are from the second semiconductor die.

14. The bonded assembly of claim 1, further comprising a packaging substrate attached to the first stack, wherein the bonding connection wires are bonded to bonding pads of the packaging substrate by wire bonding.

15. The bonded assembly of claim 1, further comprising a second stack of bonded dies which is bonded to the first stack by the bonding connection wires.

16. A method of forming a bonded assembly, comprising:
forming a first external bonding pad on a front side of a first semiconductor die;
forming first bonding pads on the first semiconductor die such that bonding-side surfaces of the first bonding pads are more distal from a substrate of the first semiconductor die than a front-side surface of the first external bonding pad is from the substrate;
forming a first sacrificial pad cover structure over the first external bonding pad;
bonding a second semiconductor die to the first semiconductor die such that the first bonding pads of the first semiconductor die are bonded to second bonding pads of the second semiconductor die;
forming a first side cavity by removing the first sacrificial pad cover structure from a sidewall of the first semiconductor die; and
forming a bonding connection wire by injecting a bonding wire material into the first side cavity directly on the first external bonding pad and by continuously extracting the bonding wire material over the sidewall of the first semiconductor die.

17. The method of claim 16, further comprising:
depositing a pad-level dielectric material layer over the first external bonding pad, wherein the first bonding pads are formed on, or in, the pad-level dielectric material layer;
forming a recess region by recessing a portion of the pad-level dielectric material layer around the external bonding pad such that the front-side surface of the first external bonding pad is physically exposed; and
forming the first sacrificial pad cover structure in the recess region on the front-side surface of the first external bonding pad.

18. The method of claim 17, wherein removing the first sacrificial pad cover structure from the sidewall of the first semiconductor die comprises isotropically removing a material of the first sacrificial pad cover structure selective to materials of the first external bonding pad and the pad-level dielectric material layer.

19. The method of claim 17, wherein recessing the portion of the pad-level dielectric material layer around the external bonding pad comprises:
forming a patterned photoresist layer including an opening having a periphery located outside of, and laterally enclosing, a periphery of the first external bonding pad in a plan view along a direction perpendicular to a top surface of the first external bonding pad; and anisotropically etching portions of the pad-level dielectric material layer within an area of the opening in the patterned photoresist layer such that sidewalls of the first external bonding pad are physically exposed, wherein the bonding connection wire is formed on the sidewalls of the first external bonding pads.

20. The method of claim 16, further comprising:

forming a second external bonding pad on the second semiconductor die;

forming a second sacrificial pad cover structure on the second external bonding pad prior to bonding the second semiconductor die to the first semiconductor die;

forming a second side cavity by removing the second sacrificial pad cover structure from a sidewall of the second semiconductor die; and injecting the bonding wire material into the second side cavity directly on the second external bonding pad and continuously extracting the bonding wire material to the first side cavity over a sidewall of the second semiconductor die and over the sidewall of the first semiconductor die.

\* \* \* \* \*